United States Patent
Kozuma et al.

(10) Patent No.: US 9,721,968 B2
(45) Date of Patent: Aug. 1, 2017

(54) SEMICONDUCTOR DEVICE, ELECTRONIC COMPONENT, AND ELECTRONIC APPLIANCE

(71) Applicant: Semiconductor Energy Laboratory Co., Ltd., Atsugi-shi, Kanagawa-ken (JP)

(72) Inventors: Munehiro Kozuma, Kanagawa (JP); Atsushi Miyaguchi, Kanagawa (JP)

(73) Assignee: Semiconductor Energy Laboratory Co., Ltd., Atsugi-Shi, Kanagawa-Ken (JP)

(*) Notice: Subject to any disclaimer, the term of this patent is extended or adjusted under 35 U.S.C. 154(b) by 162 days.

(21) Appl. No.: 14/609,888

(22) Filed: Jan. 30, 2015

(65) Prior Publication Data
US 2015/0221672 A1    Aug. 6, 2015

(30) Foreign Application Priority Data

Feb. 6, 2014 (JP) .................. 2014-021024
Feb. 7, 2014 (JP) .................. 2014-021924

(51) Int. Cl.
*H01L 27/12* (2006.01)
*H01L 29/786* (2006.01)
*H01L 29/78* (2006.01)

(52) U.S. Cl.
CPC ...... *H01L 27/1207* (2013.01); *H01L 27/1225* (2013.01); *H01L 29/7869* (2013.01); *H01L 29/78696* (2013.01); *H01L 29/785* (2013.01)

(58) Field of Classification Search
None
See application file for complete search history.

(56) References Cited

U.S. PATENT DOCUMENTS 4,870,302 A    9/1989  Freeman
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Duy T Nguyen
*Assistant Examiner* — Bo Bin Jang
(74) *Attorney, Agent, or Firm* — Fish & Richardson P.C.

(57) ABSTRACT

A semiconductor device with a novel structure that can consume less power and have a reduced size of a circuit. In the semiconductor device, when configuration operation is started in a path transistor in a configuration memory, supply of an H-level potential to a signal pass node is stopped and then the potential of the signal pass node is set at L level, whereby configuration data is input to a memory potential retaining node, which is a gate of the path transistor. After the configuration operation is completed, the supply of the H-level potential to the signal pass node is resumed so that capacitive coupling occurs between the path transistor and the memory potential retaining node and increase the gate potential of the path transistor, so that a boosting effect is obtained. The above structure eliminates the need for a keeper circuit, reducing the power consumption and the circuit area.

21 Claims, 24 Drawing Sheets

(56) References Cited

U.S. PATENT DOCUMENTS

| | | |
|---|---|---|
| 5,744,864 A | 4/1998 | Cillessen et al. |
| 6,172,521 B1 | 1/2001 | Motomura |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,896,345 B2 | 11/2014 | Fukutome |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0032444 A1* | 2/2011 | Yamazaki ........... H01L 27/1225 349/42 |
| 2011/0175646 A1 | 7/2011 | Takemura et al. |
| 2012/0293200 A1 | 11/2012 | Takemura et al. |
| 2012/0293201 A1 | 11/2012 | Fujita et al. |
| 2012/0293202 A1 | 11/2012 | Nishijima et al. |
| 2012/0293206 A1 | 11/2012 | Yoneda et al. |
| 2012/0293209 A1 | 11/2012 | Takewaki |
| 2012/0293242 A1 | 11/2012 | Kato |
| 2013/0207170 A1 | 8/2013 | Kurokawa |
| 2013/0285697 A1 | 10/2013 | Kurokawa |
| 2013/0286757 A1 | 10/2013 | Takemura |
| 2013/0293262 A1 | 11/2013 | Takemura |
| 2013/0293263 A1 | 11/2013 | Kurokawa |
| 2013/0314124 A1 | 11/2013 | Ikeda et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-251894 | 12/2013 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID Digest International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1996, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IgZo Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 398-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.nN. et al., "Spinel,YbFe2O4, and Yb2Fe3O7 Types of Structures for Compounds in the In2O3 and Sc2O3—A2O3—Bo Systems [A; Fe, Ga, Or, Al; B: Mg, Fe, Ni, Cu,Or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Eng Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

FIG. 10A
FIG. 10B
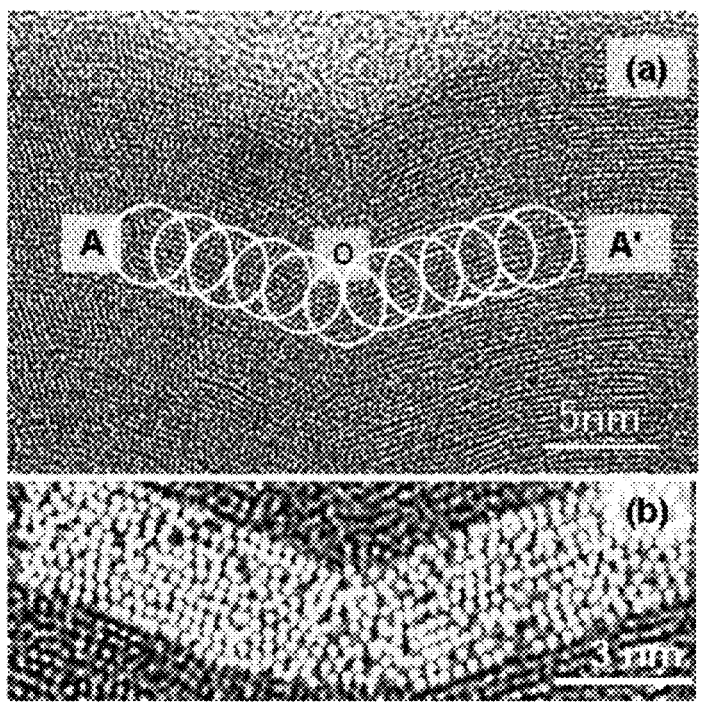
FIG. 10C
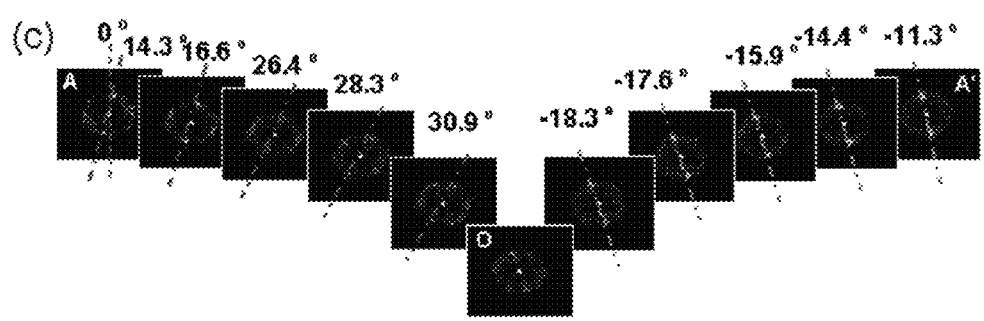

CAAC-OS nc-OS as-sputtered after heat treatment at 450℃

SEMICONDUCTOR DEVICE, ELECTRONIC COMPONENT, AND ELECTRONIC APPLIANCE

BACKGROUND OF THE INVENTION

1. Field of the Invention

One embodiment of the present invention relates to a semiconductor device, an electronic component, or an electronic appliance.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, a method for driving any of them, and a method for manufacturing any of them.

2. Description of the Related Art

A programmable logic device (PLD) includes a plurality of programmable logic elements and a plurality of programmable switch elements. In the PLD, data on a function of each programmable logic element and data on a connection between programmable logic elements by the programmable switch elements are stored as configuration data in a configuration memory.

In a configuration memory that has recently become widely available, configuration data is stored in an inverter loop used in a static random access memory (SRAM). A potential to be retained in the inverter loop is supplied to a gate of a path transistor and an output signal is output. Change of the function of a programmable logic element, and the like can be performed using the output signal.

In recent years, a structure of a configuration memory in which one of a source and a drain of a transistor including a channel in an oxide semiconductor layer is connected to a gate of a path transistor, and a potential corresponding to configuration data is retained in the gate of the path transistor has been proposed (see Patent Document 1).

REFERENCE

Patent Document 1: Japanese Published Patent Application No. 2013-251894

SUMMARY OF THE INVENTION

In the case where a potential retained in an inverter loop and the potential of an output signal are equal in a path transistor that is an n-channel transistor, a decrease in the potential of the output signal by the amount of threshold voltage is caused. In that case, a keeper circuit including an inverter loop and the like is needed for a node to which the output signal is output.

Although the keeper circuit can maintain the normal voltage amplitude of an output signal, it causes problems such as an increase in power consumption and an increase in the circuit area.

In view of the problems, an object of one embodiment of the present invention is to provide a semiconductor device or the like with a novel structure in which the power consumption can be reduced. Another object of one embodiment of the present invention is to provide a semiconductor device or the like with a novel structure in which the circuit area can be reduced. Another object of one embodiment of the present invention is to provide a novel semiconductor device or the like.

Note that the object of one embodiment of the present invention is not limited to the above objects. The above objects do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device that includes first to fifth transistors. A gate of the first transistor is electrically connected to a first wiring, and one of a source and a drain of the first transistor is electrically connected to a second wiring. A gate of the second transistor is electrically connected to the first wiring, and one of a source and a drain of the second transistor is electrically connected to a third wiring. A gate of the third transistor is electrically connected to the other of the source and the drain of the first transistor. A gate of the fourth transistor is electrically connected to the other of the source and the drain of the second transistor. A gate of the fifth transistor is electrically connected to a fourth wiring, one of a source and a drain of the fifth transistor is electrically connected to a fifth wiring, and the other of the source and the drain of the fifth transistor is electrically connected to one of a source and a drain of the third transistor. One of a source and a drain of the fourth transistor is electrically connected to a sixth wiring. The one of the source and the drain of the third transistor is electrically connected to a seventh wiring. The one of the source and the drain of the fourth transistor is electrically connected to the seventh wiring. The first wiring has a function of transmitting a first signal. The second wiring has a function of transmitting a second signal. The third wiring has a function of transmitting a third signal. The fourth wiring has a function of transmitting a fourth signal. The fifth wiring has a function of transmitting an H-level potential. The sixth wiring has a function of transmitting an L-level potential. The seventh wiring has a function of transmitting the potential of the fifth wiring or the potential of the sixth wiring. The first signal has a function of controlling the conduction states of the first transistor and the second transistor. The second signal has a function of controlling the conduction state of the third transistor. The third signal has a function of controlling the conduction state of the fourth transistor. The fourth signal has a function of controlling the conduction state of the fifth transistor.

Another embodiment of the present invention is a semiconductor device that includes first to sixth transistors. A gate of the first transistor is electrically connected to a first wiring, and one of a source and a drain of the first transistor is electrically connected to a second wiring. A gate of the second transistor is electrically connected to the first wiring, and one of a source and a drain of the second transistor is electrically connected to a third wiring. A gate of the third transistor is electrically connected to the other of the source and the drain of the first transistor. A gate of the fourth transistor is electrically connected to the other of the source and the drain of the second transistor. A gate of the fifth transistor is electrically connected to a fourth wiring, one of a source and a drain of the fifth transistor is electrically connected to a fifth wiring, and the other of the source and the drain of the fifth transistor is electrically connected to one of a source and a drain of the third transistor. One of a source and a drain of the fourth transistor is electrically connected to a sixth wiring. The one of the source and the drain of the third transistor is electrically connected to a seventh wiring. The one of the source and the drain of the fourth transistor is electrically connected to the seventh wiring. A gate of the sixth transistor is electrically connected to an eighth wiring, one of a source and a drain of the sixth transistor is electrically connected to the other of the source and the drain of the fifth transistor, and the other of the source and the drain of the sixth transistor is electrically connected to the sixth wiring. The first wiring has a function of transmitting a first signal. The second wiring has a function of transmitting a second signal. The third wiring has a function of transmitting a third signal. The fourth wiring has a function of transmitting a fourth signal. The fifth wiring has a function of transmitting an H-level potential. The sixth wiring has a function of transmitting an L-level potential. The seventh wiring has a function of transmitting the potential of the fifth wiring or the potential of the sixth wiring. The eighth wiring has a function of transmitting a fifth signal. The first signal can control the conduction states of the first transistor and the second transistor. The second signal has a function of controlling the conduction state of the third transistor. The third signal has a function of controlling the conduction state of the fourth transistor. The fourth signal has a function of controlling the conduction state of the fifth transistor. The fifth signal has a function of controlling the conduction state of the sixth transistor.

Note that other embodiments of the present invention will be described in the following embodiments with reference to the drawings.

One embodiment of the present invention can provide a semiconductor device or the like with a novel structure in which the power consumption can be reduced. Another embodiment of the present invention can provide a semiconductor device or the like with a novel structure in which the circuit area can be reduced. Another embodiment of the present invention can provide a novel semiconductor device or the like.

Note that the effect of one embodiment of the present invention is not limited to the above effects. The above effects do not disturb the existence of other effects. The other effects are the ones that are not described above and will be described below. The other effects will be apparent from and can be derived from the description of the specification, the drawings, and the like by those skilled in the art. One embodiment of the present invention is to solve at least one of the above effects and the other effects. Accordingly, one embodiment of the present invention does not have the above effects in some cases.

BRIEF DESCRIPTION OF THE DRAWINGS

FIGS. 10A to 10C are cross-sectional TEM images and a local Fourier transform image of an oxide semiconductor.

DETAILED DESCRIPTION OF THE INVENTION

Figure 1:
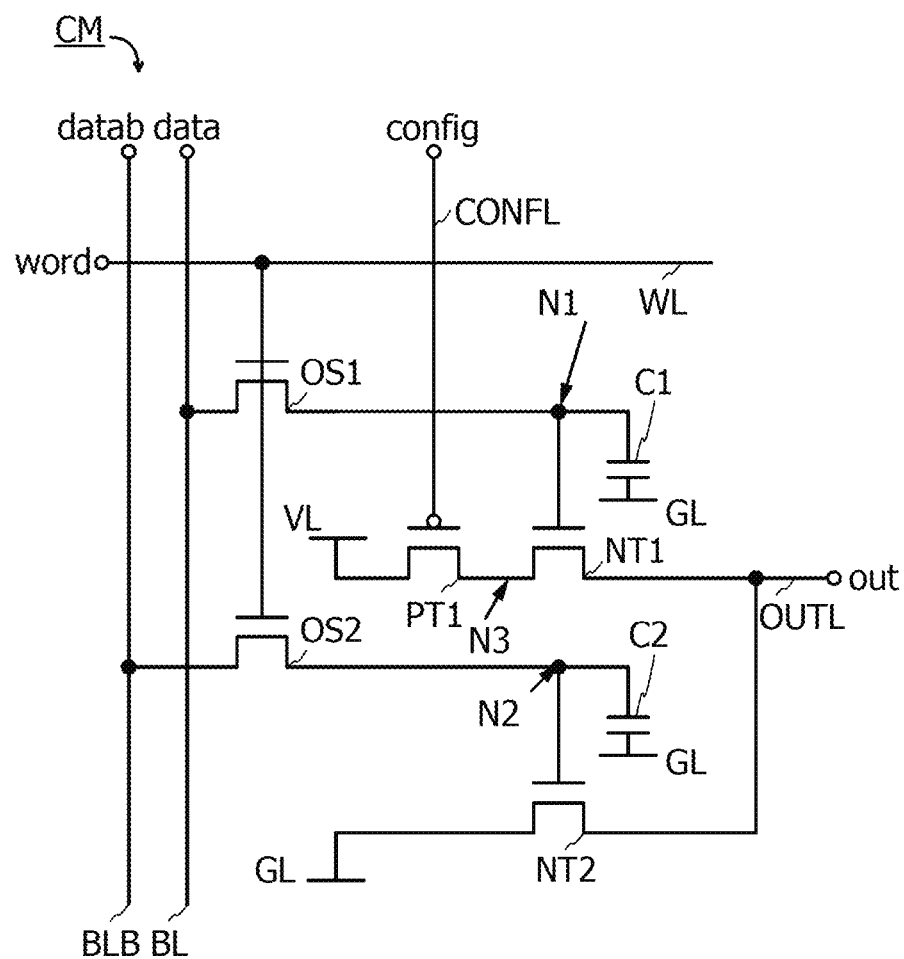
FIG. 1 is a circuit diagram illustrating one embodiment of the present invention.

Hereinafter, embodiments will be described with reference to the accompanying drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In the drawings, the size, the layer thickness, or the region is exaggerated for clarity in some cases. Therefore, embodiments of the invention are not limited to such scales. Note that the drawings are schematic views showing ideal examples, and embodiments of the present invention are not limited to the shapes or the values in the drawings. For example, variation in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions that are just examples. Here, X, Y, Z1, and Z2 each denote an object (e.g., a device, an element, a circuit, a wiring, an electrode, a terminal, a conductive film, and a layer).

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

(Embodiment 1)

In this embodiment, a circuit diagram of a semiconductor device that can be used as a configuration memory and an example of a structure of a timing chart are described.

In this specification and the like, a semiconductor device generally means a device that can function by utilizing semiconductor characteristics. Thus, a programmable logic device (hereinafter, PLD) including semiconductor elements such as transistors, a plurality of programmable logic elements (hereinafter, PLE) and programmable switch elements (hereinafter, PSE) included in the PLD, configuration memories included in the PLE and PSE, and the like are semiconductor devices.

Figure 19:
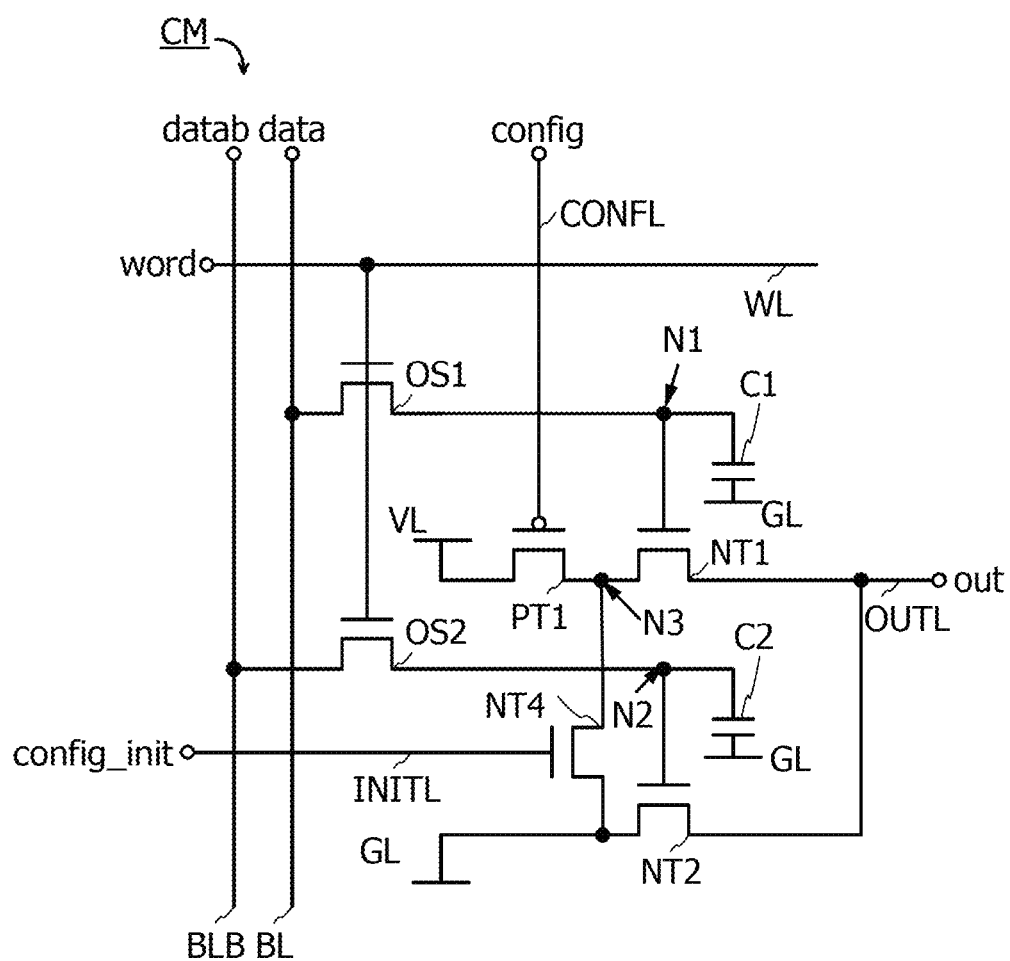
FIG. 19 is a circuit diagram illustrating one embodiment of the present invention.

FIG. 1 and FIG. 19 each illustrate a circuit configuration of a configuration memory that is a semiconductor device. Note that only parts in FIG. 19 that differ from those in FIG. 1 are described and the same parts between FIG. 1 and FIG. 19 are not described.

A configuration memory CM illustrated in FIG. 1 includes a transistor OS1, a transistor OS2, a transistor NT1, a transistor NT2, a transistor PT1, a capacitor C1, and a capacitor C2. In FIG. 1, a gate of the transistor NT1 is a node N1, a gate of the transistor NT2 is a node N2, and one of a source and a drain of the transistor NT1 is a node N3.

The configuration memory CM illustrated in FIG. 1 includes a wiring WL for inputting a word signal word, a wiring BL for inputting a data signal data, a wiring BLB for inputting a data signal datab, a wiring CONFL for inputting a configuration state signal config, and a wiring OUTL for inputting an output signal out. In addition, a wiring VL and a wiring GL are included.

In contrast, a configuration memory CM illustrated in FIG. 19 includes the transistor OS1, the transistor OS2, the transistor NT1, the transistor NT2, a transistor NT4, the transistor PT1, the capacitor C1, and the capacitor C2. Note that in FIG. 19, a gate of the transistor NT1 is the node N1, a gate of the transistor NT2 is the node N2, and one of a source and a drain of the transistor NT1 is the node N3.

The configuration memory CM illustrated in FIG. 19 includes the wiring WL for inputting a word signal word, the wiring BL for inputting a data signal data, the wiring BLB for inputting a data signal datab, the wiring CONFL for inputting a configuration state signal config, the wiring INITL for inputting a configuration initiation signal config_init, and the wiring OUTL for inputting an output signal out. In addition, the wiring VL and the wiring GL are included.

An example of the configuration memory CM is a configuration memory included in a PLE. The configuration memory included in the PLE is a circuit that functions as a memory circuit of a lookup table (LUT) and inputs an H-level or L-level output signal. Switching between the H-level and L-level output signals from the configuration memory CM is performed, whereby the function of the PLE can be changed.

A gate of the transistor OS1 is connected to the wiring WL. One of a source and a drain of the transistor OS1 is connected to the wiring BL. The other of the source and the drain of the transistor OS1 is connected to the gate of the transistor NT1.

A gate of the transistor OS2 is connected to the wiring WL. One of a source and a drain of the transistor OS2 is connected to the wiring BLB. The other of the source and the drain of the transistor OS2 is connected to the gate of the transistor NT2.

Note that the transistors OS1 and OS2 are preferably transistors with low off-state current. By using transistors with low off-state current as the transistors OS1 and OS2, the amount of electric charge transfer in the nodes N1 and N2 can be extremely small when the nodes N1 and N2 are brought out of electrical conduction. Thus, a circuit including the nodes N1 and N2 can function as a memory circuit.

The transistor with low off-state current is, for example, a transistor in which an oxide semiconductor is used for a semiconductor layer in which a channel is formed. The normalized off-state current per micrometer of a channel width at room temperature (approximately 25° C.) of the transistor including an oxide semiconductor film can be lower than or equal to $1\times10^{-18}$ A, preferably lower than or equal to $1\times10^{-21}$ A, further preferably lower than or equal to $1\times10^{-24}$ A. The normalized off-state current per micrometer of a channel width at 85° C. can be lower than or equal to $1\times10^{-15}$ A, preferably lower than or equal to $1\times10^{-18}$ A, further preferably lower than or equal to $1\times10^{-21}$ A.

Note that off-state current of an n-channel transistor refers to a current that flows between a source and a drain when the transistor is off. If the threshold voltage of the n-channel transistor is, for example, approximately 0 V to 2 V, the off-state current can refer to current that flows between the source and the drain when a negative voltage is applied between a gate and the source.

The word signal word input to the wiring WL controls the conduction states of the transistors OS1 and OS2. In this specification, the transistors OS1 and OS2 are described as n-channel transistors. Thus, the transistors OS1 and OS2 are turned on when the word signal word has an H-level potential, whereas the transistors OS1 and OS2 are turned off when the signal has an L-level potential.

The data signal data input to the wiring BL controls the conduction state of the transistor NT1. In this specification, the transistor NT1 is described as an n-channel transistor. Thus, the transistor NT1 is turned on when the data signal data has an H-level potential, whereas the transistor NT1 is turned off when the signal has an L-level potential.

The data signal datab input to the wiring BLB controls the conduction state of the transistor NT2. In this specification, the transistor NT2 is described as an n-channel transistor. Thus, the transistor NT2 is turned on when the data signal datab has an H-level potential, whereas the transistor NT2 is turned off when the signal has an L-level potential.

Figure 18:
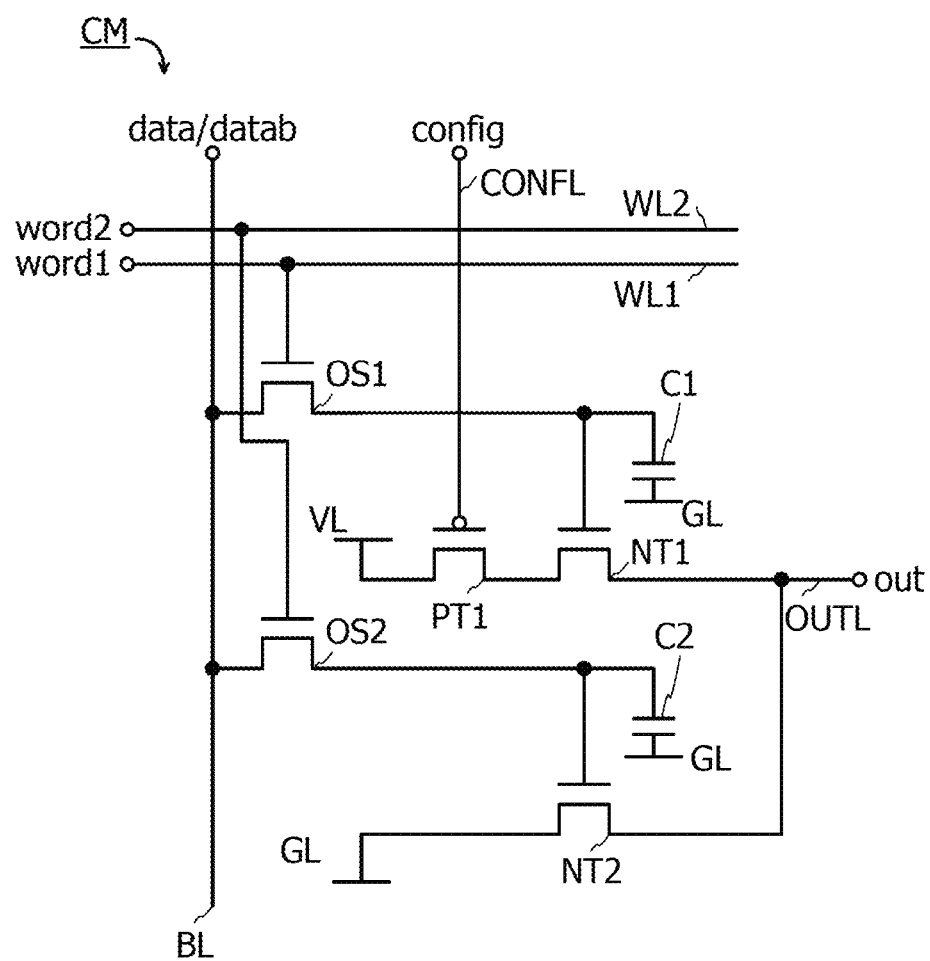
FIG. 18 is a circuit diagram illustrating one embodiment of the present invention.
Figure 24:
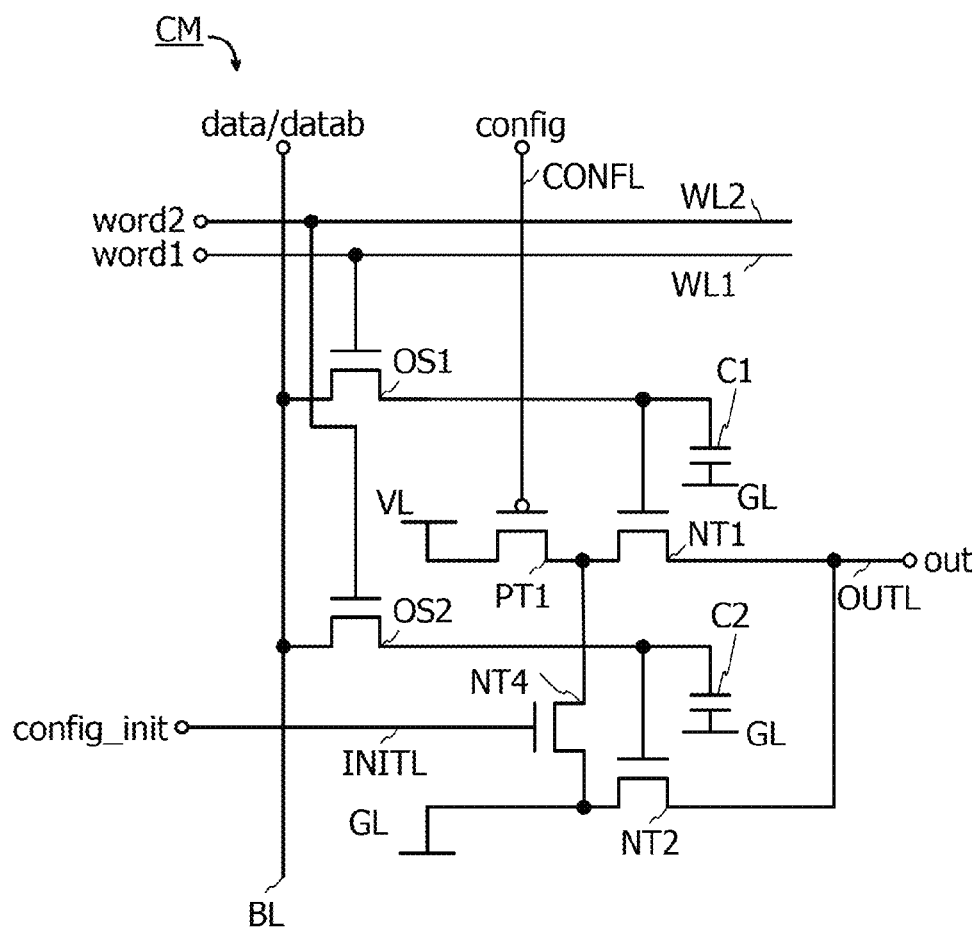
FIG. 24 is a circuit diagram illustrating one embodiment of the present invention.

Note that although the wirings BL and BLB are different wirings in FIG. 1 and FIG. 19, the data signals data and datab may be input to one wiring BL at different timings. For example, circuit configurations illustrated in FIG. 18 and FIG. 24 can be employed. FIG. 18 and FIG. 24 illustrate circuit configurations in which the wiring WL in FIG. 1 and FIG. 19 is replaced with a wiring WL1 and a wiring WL2 and the data signals data and datab are input to the wiring BL. This configuration allows the transistors OS1 and OS2 to be turned on at different timings.

A gate of the transistor NT1 is connected to the other of the source and the drain of the transistor OS1. The one of the source and the drain of the transistor NT1 is connected to one of a source and a drain of the transistor PT1. The other of the source and the drain of the transistor NT1 is connected to the wiring OUTL.

A gate of the transistor NT2 is connected to the other of the source and the drain of the transistor OS2. The one of the source and the drain of the transistor NT2 is connected to the wiring GL. The other of the source and the drain of the transistor NT2 is connected to the wiring OUTL.

The output signal out input to the wiring OUTL changes the function of the PLE. The output signal out having an H-level potential is preferably supplied such that a decrease in the potential by the amount of the threshold voltage of the transistor NT1 does not occur.

A gate of the transistor PT1 is connected to the wiring CONFL. The other of the source and the drain of the transistor PT1 is connected to the wiring VL. The one of the source and the drain of the transistor PT1 is connected to the one of the source and the drain of the transistor NT1.

In FIG. 19, a gate of the transistor NT4 is connected to the wiring INITL. One of a source and a drain of the transistor NT4 is connected to the one of the source and the drain of the transistor NT1. The other of the source and the drain of the transistor NT4 is connected to the wiring GL.

Note that the transistors NT1, NT2, NT4, and PT1 are each preferably a transistor using silicon in a semiconductor layer in which a channel is formed. The transistor using silicon in a semiconductor layer in which a channel is formed is preferably used, in which case a transistor using an oxide semiconductor in a semiconductor layer in which a channel is formed can be provided to overlap with the transistor using silicon, resulting in reduced size of a semiconductor device.

Note that the transistors NT1, NT2, and NT4 may each be a transistor with low off-state current. As described above, a transistor using an oxide semiconductor in a semiconductor layer in which a channel is formed may be used as the transistor with low off-state current. By using the transistor using an oxide semiconductor in a semiconductor layer in which a channel is formed as each of the transistors NT1, NT2, and NT4, the amount of electric charge transfer can be extremely small while the transistors NT1, NT2, and NT4 are off.

An H-level potential supplied to the wiring VL is, for example, a potential VDD. An L-level potential supplied to the wiring GL is, for example, a potential GND. The L-level potential may alternatively be a potential VSS. The H-level potential supplied to the wiring VL and the L-level potential supplied to the wiring GL are the potential of the output signal out input to the wiring OUTL. Thus, the potential of the output signal out is preferably supplied to the wiring OUTL while maintaining the potentials supplied to the wirings VL and GL, in which case the function of the PLE can be changed more accurately.

The configuration state signal config input to the wiring CONFL controls the conduction state of the transistor PT1. In this specification, the transistor PT1 is described as a p-channel transistor. Thus, the transistor PT1 is turned on when the configuration state signal config has an L-level potential, whereas the transistor PT1 is turned off when the signal has an H-level potential. When the transistor PT1 is a p-channel transistor, a decrease in the H-level potential of the wiring VL supplied to the node N3 through the transistor PT1 by the amount of threshold voltage does not occur.

In FIG. 19, the configuration initialization signal config_init input to the wiring INITL controls the conduction state of the transistor NT4. In this specification, the transistor NT4 is described as an n-channel transistor. Thus, the transistor NT4 is turned on when the configuration initialization signal config_init has an H-level potential, whereas the transistor NT4 is turned off when the signal has an L-level potential.

The transistors NT1 and NT2 also function as path transistors. The nodes N1 and N2 each have a function of storing configuration data by retaining the potentials. The transistors OS1 and OS2 have a function of retaining the potentials of the nodes N1 and N2 when off. The node N3 functions as a signal pass node. The conduction state of the transistor PT1 is controlled in order to perform switching between supply of an H-level potential to the signal pass node and stop of the supply.

One electrode and the other electrode of the capacitor C1 are connected to the gate of the transistor NT1 and the wiring GL, respectively.

One electrode and the other electrode of the capacitor C2 are connected to the gate of the transistor NT2 and the wiring GL, respectively.

Figure 9:
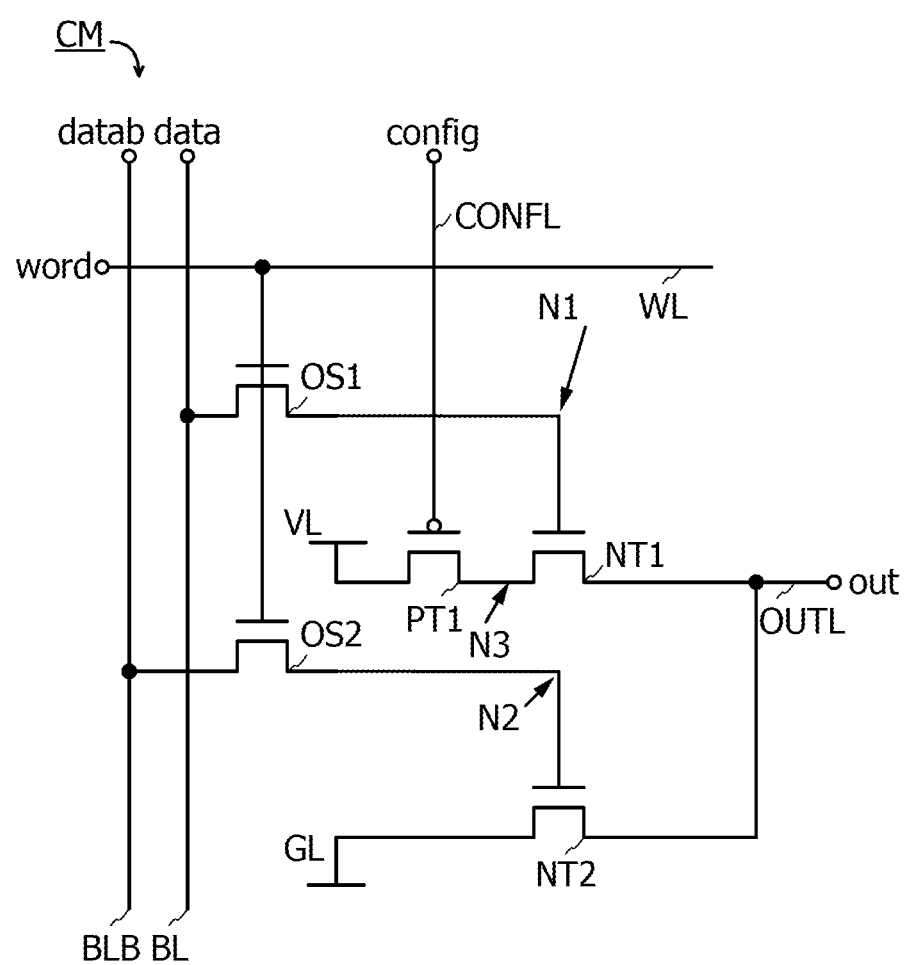
FIG. 9 is a circuit diagram illustrating one embodiment of the present invention.
Figure 22:
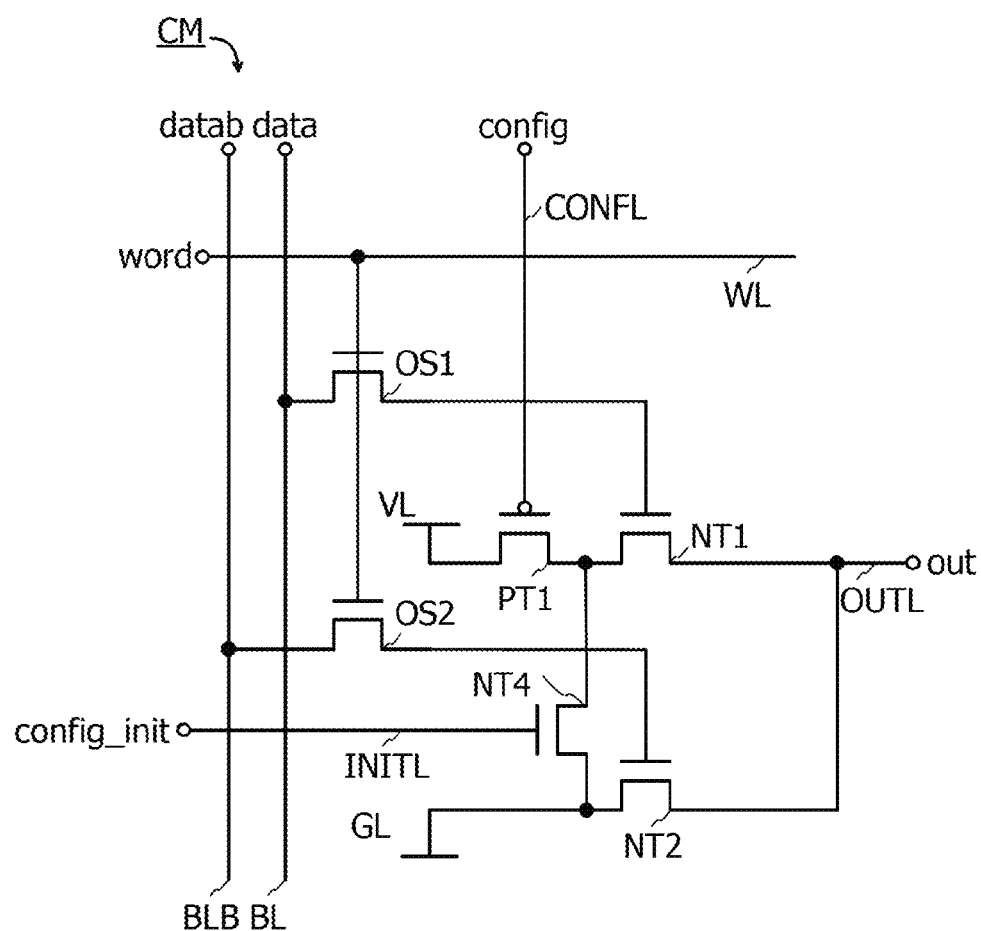
FIG. 22 is a circuit diagram illustrating one embodiment of the present invention.

Note that the capacitors C1 and C2 do not need to be provided when the gate capacitance of the transistors NT1 and NT2 is increased. Circuit configurations of that case are illustrated in FIG. 9 and FIG. 22.

Figure 17A:
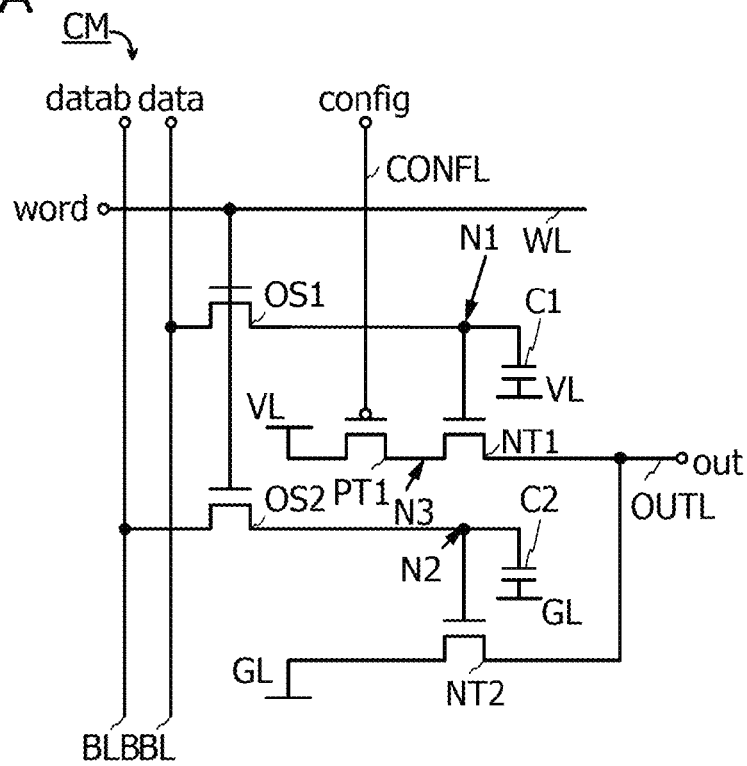
FIGS. 17A and 17B are circuit diagrams illustrating one embodiment of the present invention.
Figure 17B:
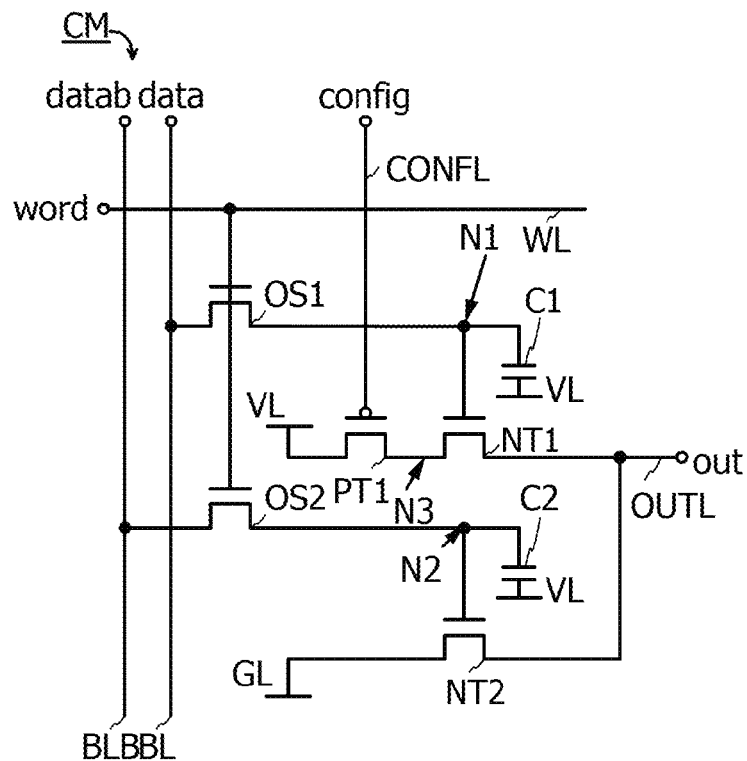
Figure 23A:
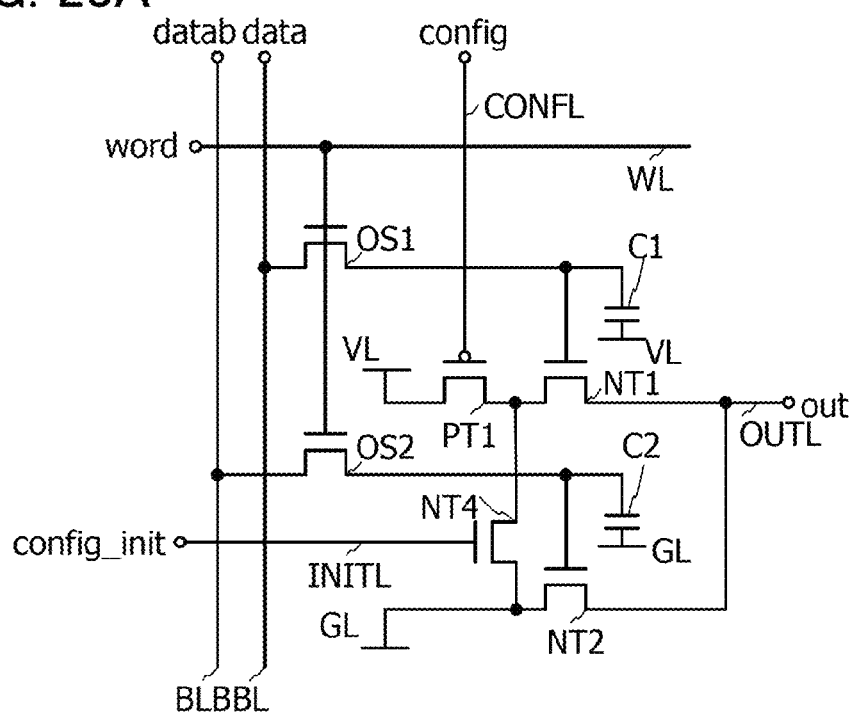
FIGS. 23A and 23B are circuit diagrams illustrating one embodiment of the present invention.
Figure 23B:
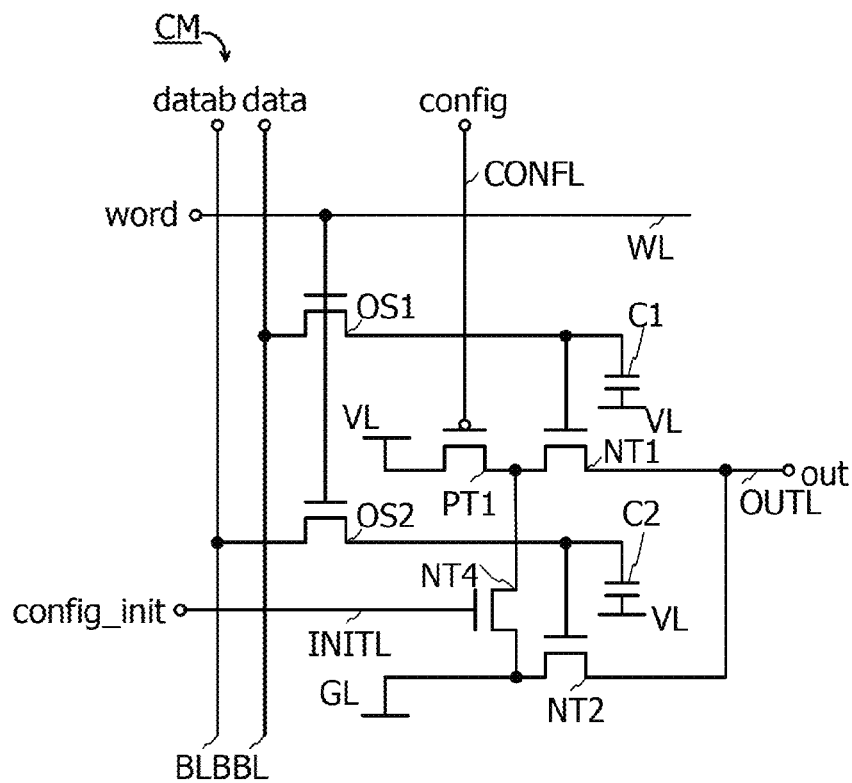

Although the other electrodes of the capacitors C1 and C2 are connected to the wiring GL in the circuit configurations in FIG. 1 and FIG. 19, they may be connected to another wiring. For example, as in circuit configurations in FIG. 17A and FIG. 23A, the other electrode of the capacitor C1 may be connected to the wiring VL and the other electrode of the capacitor C2 may be connected to the wiring GL. Alternatively, as in circuit configurations in FIG. 17B and FIG. 23B, the other electrodes of the capacitors C1 and C2 may be connected to the wiring VL.

When the configuration memory CM illustrated in FIG. 1 and FIG. 19, which is a semiconductor device, starts configuration operation, supply of an H-level potential to the node N3 is stopped, and then the potential of the node N3 is set at L-level. Then, a potential to be configuration data is supplied to the node N1 that is the gate of the transistor NT1. After the completion of the configuration operation, supply of an H-level potential to the node N3 is resumed, so that capacitive coupling occurs between the transistor NT1 and the node N1 and the gate potential of the transistor NT1 increases, resulting in a boosting effect. Owing to the above-described structure, a decrease in the potential of an output signal transmitted through the transistor NT1 by the amount of threshold voltage does not occur. As a result, a keeper circuit is not necessary for the wiring OUTL. Thus, the power consumption and the circuit area of the semiconductor device can be reduced.

Figure 2:
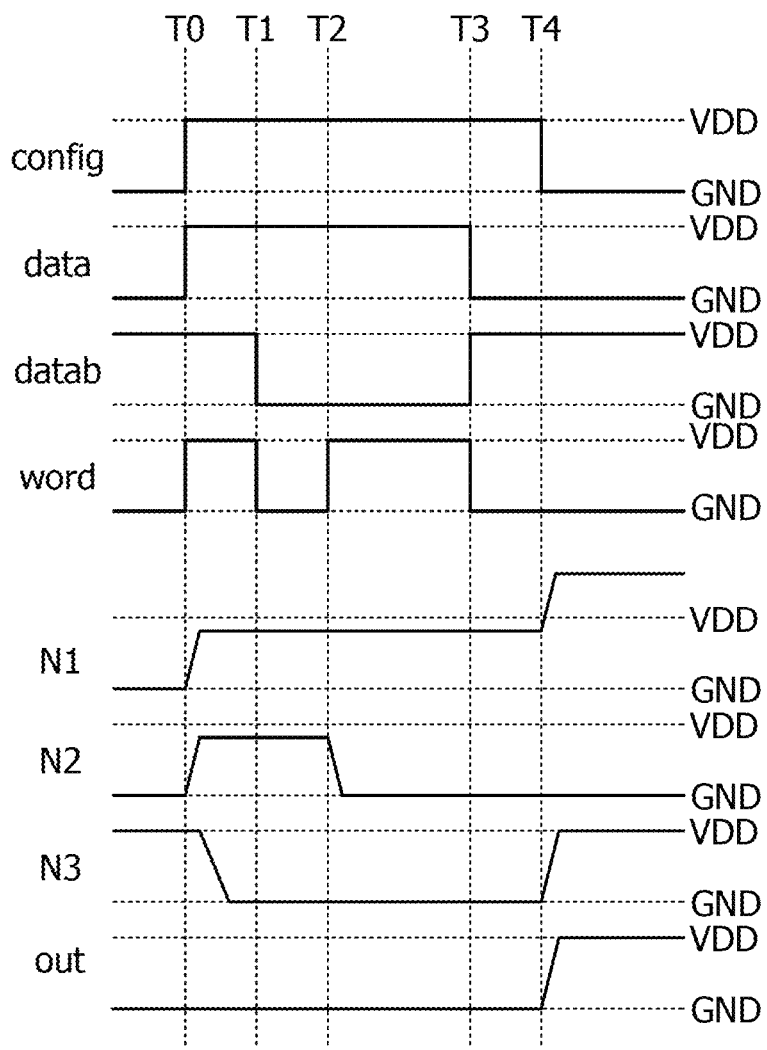
FIG. 2 is a timing chart illustrating one embodiment of the present invention.
Figure 20:
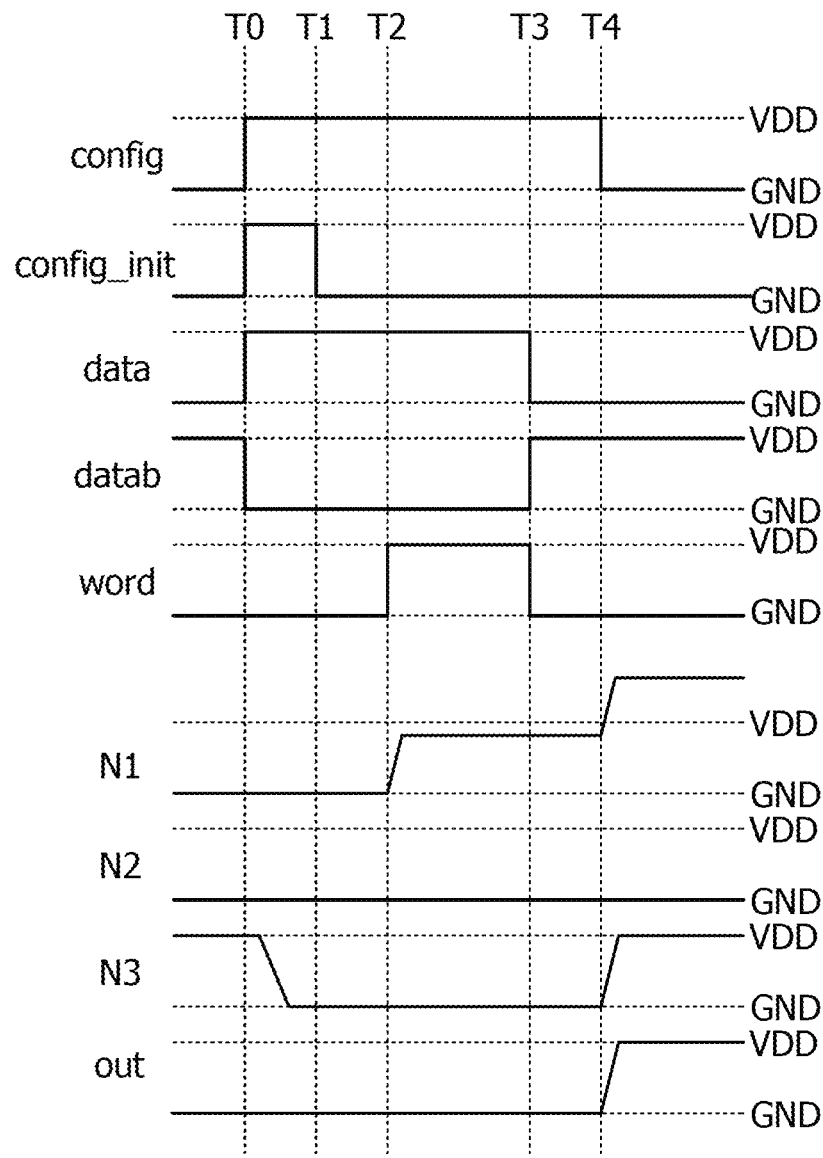
FIG. 20 is a timing chart illustrating one embodiment of the present invention.

Next, the operation of the configuration memory CM illustrated in FIG. 1 and FIG. 19 is described. FIG. 2 and FIG. 20 are timing charts of signals and the potentials of the nodes that are input and output in circuit blocks illustrated in FIG. 1 and FIG. 19 in configuration setting operation. Note that only parts in FIG. 20 that differ from those in FIG. 2 are described and the same parts between FIG. 2 and FIG. 20 are not described.

FIG. 2 shows changes of the configuration state signal config, the data signal data, the data signal datab, the word signal word, the node N1, the node N2, the node N3, and the output signal out, which are shown in FIG. 1. Note that for convenience of explanation, the timings at which signals are changed are denoted by Time T0 to Time T4 in FIG. 2.

FIG. 20 shows changes of the configuration state signal config, the configuration initialization signal config_init, the data signal data, the data signal datab, the word signal word, the node N1, the node N2, the node N3, and the output signal out, which are shown in FIG. 19. Note that for convenience of explanation, the timings at which signals are changed are denoted by Time T0 to Time T4 in FIG. 20.

The configuration data held in the nodes N1 and N2 is binary data "0" or "1", and data "1" is retained as an H-level potential and data "0" is retained as an L-level potential. Note that for convenience, signals and the potentials of the nodes that are input and output in the circuit block in FIG. 1 are described using a potential VDD as the H-level potential and a potential GND as the L-level potential.

First, initialization operation is started at Time T0. Note that in the initialization operation, supply of an H-level potential to the node N3 is stopped and the potential of the node N3 is set at L-level. The initialization operation is performed every time operation for setting configuration data is performed.

At Time T0 in FIG. 2, the potential of the configuration state signal config is set at H level, the potential of the word signal word is set at H level, the potentials of the data signal data and the data signal datab are set at H level, the transistor PT1 is turned off, and the transistors OS1 and OS2 are turned on. Since the transistors OS1 and OS2 are n-channel transistors, the potentials of the nodes N1 and N2 increase to the potential decreased from the H-level potential by the amount of threshold voltage. The potentials of the nodes N1 and N2 increase, so that the transistors NT1 and NT2 that have been off are turned on. Thus, the node N3 has the L-level potential of the wiring GL.

At Time T0 in FIG. 20, the potential of the configuration state signal config is set at H level, the potential of the configuration initialization signal config_init is set at H level, the potential of the word signal word is set at L level, the potential of the data signal data is set at H level, the potential of the data signal datab is set at L level, the transistor PT1 is turned off, and the transistor NT4 is turned on. The node N3 has the L-level potential of the wiring GL.

At Time T1 in FIG. 2, the initialization operation is completed. At Time T1, the potential of the word signal word is set at L level, the potential of the data signal datab is set at L level, and the potentials of the nodes N1, N2, and N3 and the output signal out are maintained.

At Time T1 in FIG. 20, the initialization operation is completed. At Time T1, the potential of the configuration initialization signal config_init is set at L level, and the potentials of the nodes N1, N2, and N3 and the output signal out are maintained.

At Time T2, writing operation of configuration data is started. In the writing operation of the configuration data, the potentials of the data signal data and the data signal datab are changed and the potentials of the nodes N1 and N2 are rewritten. By changing the potentials of the nodes N1 and N2, the potential of the output signal out can be switched between H level and L level to be output. Note that operation in which the potentials of the data signal data and the data signal datab are set at H level and L level, respectively, to change the potentials of the nodes N1 and N2 is described as the writing operation of the configuration data in FIG. 2.

At Time T2, the potential of the word signal word is set at H level, the potential of the data signal data is set at H level, and the potential of the data signal datab is set at L level to change the potentials of the nodes N1 and N2. The potential of the node N1 is maintained at H level, and the potential of the N2 changes from H level to L level.

At Time T3, the writing operation of the configuration data is completed. At Time T3, the potential of the word signal word is set at L level and the potential of the data signal datab is set at H level. When the potential of the word signal word becomes L level, the nodes N1 and N2 are in an electrically floating state because of the low off-state current of the transistors OS1 and OS2 and retains the potential written at Time T2. Thus, the nodes N1 and N2 can function as a memory circuit that retains the configuration data thereafter.

Note that in a memory that utilizes the low off-state current of a transistor using an oxide semiconductor in a semiconductor layer in which a channel is formed, a predetermined voltage might keep being supplied to the transistor in a period for retaining data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for retaining data. However, because almost no current flows, little power is consumed. Thus, even if the predetermined voltage is supplied to the memory circuit, the memory circuit can be regarded as being substantially nonvolatile.

At Time T4, the operation for setting the configuration data is completed. When the potential of the configuration state signal config becomes L level, the transistor PT1 is turned on, the potential of the node N3 becomes H level, and then the potential of the output signal out becomes H level. With the increase in the potentials of the node N3 and the output signal out, capacitive coupling via gate capacitance occurs in the transistor NT1, and the potential of the node N1 increases.

Initialization operation for the node N3 needs to be performed at Time T0 so that capacitive coupling for increasing the potential of the node N1 occurs. The initialization operation of the node N3 allows the potential of the node N3 to remain L level, and then the node N1 is made to be in an electrically floating state, whereby the potential of the gate of the transistor NT1 can be boosted. This boosting operation enables the potential of the node N1 that is the gate of the transistor NT1 to increase to be higher than the H-level potential. When the potential of the gate of the transistor NT1 increases to be higher than the H-level potential, a decrease in the potential of the transistor NT1 by the amount of threshold voltage does not occur. As a result, the potential of the wiring VL does not decrease and can be output as the output signal out.

This embodiment can be implemented in appropriate combination with any of the other embodiments.

(Embodiment 2)

In this embodiment, an example of a structure of a PLD in which the semiconductor device described in Embodiment 1 is used as a configuration memory, and a configuration of each circuit included in the PLD are described.

<Example of Structure of PLD>

Figure 3:
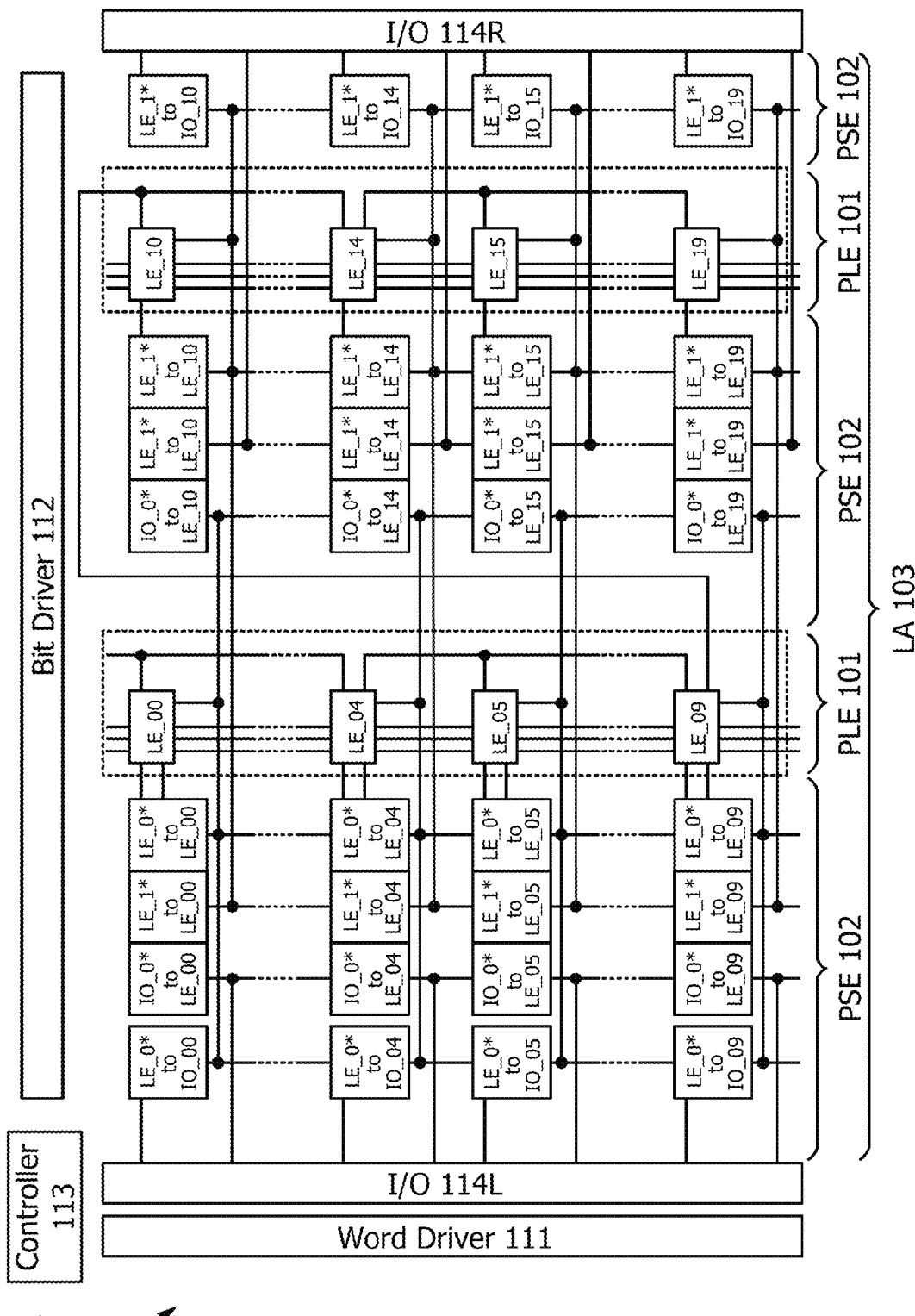
FIG. 3 is a block diagram illustrating one embodiment of the present invention.

An example of a structure of a PLD is described. FIG. 3 is a block diagram of a PLD.

FIG. 3 is a block diagram illustrating a structure of a PLD 100 in which a logic array (LA) 103 including PLEs 101 and PSEs 102, a word line driver circuit (Word Driver) 111, a bit line driver circuit (Bit Driver) 112, a control circuit (Controller) 113, an input/output terminal portion (I/O) 114L, and an input/output terminal portion (I/O) 114R are arranged.

FIG. 3 illustrates an example in which PLEs and PSEs are arranged in a matrix.

The PLE 101 in FIG. 3 includes 20 PLEs. Note that for convenience of explanation, the PLEs are denoted by "LE_00" to "LE_19" in the blocks in FIG. 3.

FIG. 3 illustrates an example in which four PSEs are provided for one PLE (e.g., "LE_01"). For example, with regard to "LE_00" in FIG. 3, four blocks that are denoted by "LE_0* to IO_00", "IO_0* to LE_00", "LE_1* to LE_00", and "LE_0* to LE_00" in the blocks correspond to the four PSEs.

The PSE "LE_0* to IO_00" in FIG. 3 means a PSE for controlling electrical continuity between any one of the PLEs "LE_00" to "LE_09" and a first input/output terminal of the input/output terminal portion 114L. The PSE "IO_0* to LE_00" means a PSE for controlling electrical continuity between any one of first to tenth input/output terminals of the input/output terminal portion 114L and "LE_00". The PSE "LE_1* to LE_00" means a PSE for controlling electrical continuity between any one of the PLEs "LE_10" to "LE_19" and the PLE "LE_00". The PSE "LE_0* to LE_00" means a PSE for controlling electrical continuity between any one of the PLEs "LE_00" to "LE_09" and the PLE "LE_00". The PSE 102 allows the PLD 100 to change connection between the PLE 101, the PSE 102, the input/output terminal portion 114L, and the input/output terminal portion 114R and to have a circuit configuration of which functions can be changed in accordance with configuration data.

Note that although not illustrated in FIG. 3, word signals are input from the word line driver circuit 111 to the PLEs 101 and PSEs 102. Configuration data is input from the bit line driver circuit 112 to the PLEs 101 and the PSEs 102. The control circuit 113 has a function of controlling the word line driver circuit 111 and the bit line driver circuit 112.

Note that the input/output terminal portion 114L and the input/output terminal portion 114R in FIG. 3 each have a terminal for inputting/outputting signals to/from the LA 103. For example, the input/output terminal portion 114L and the input/output terminal portion 114R each include 20 input/output terminals "IO_00" to "IO_19" corresponding to the PLEs "LE_00" to "LE_19" as described above.

<Example of Structure of PLE>

Figure 4:
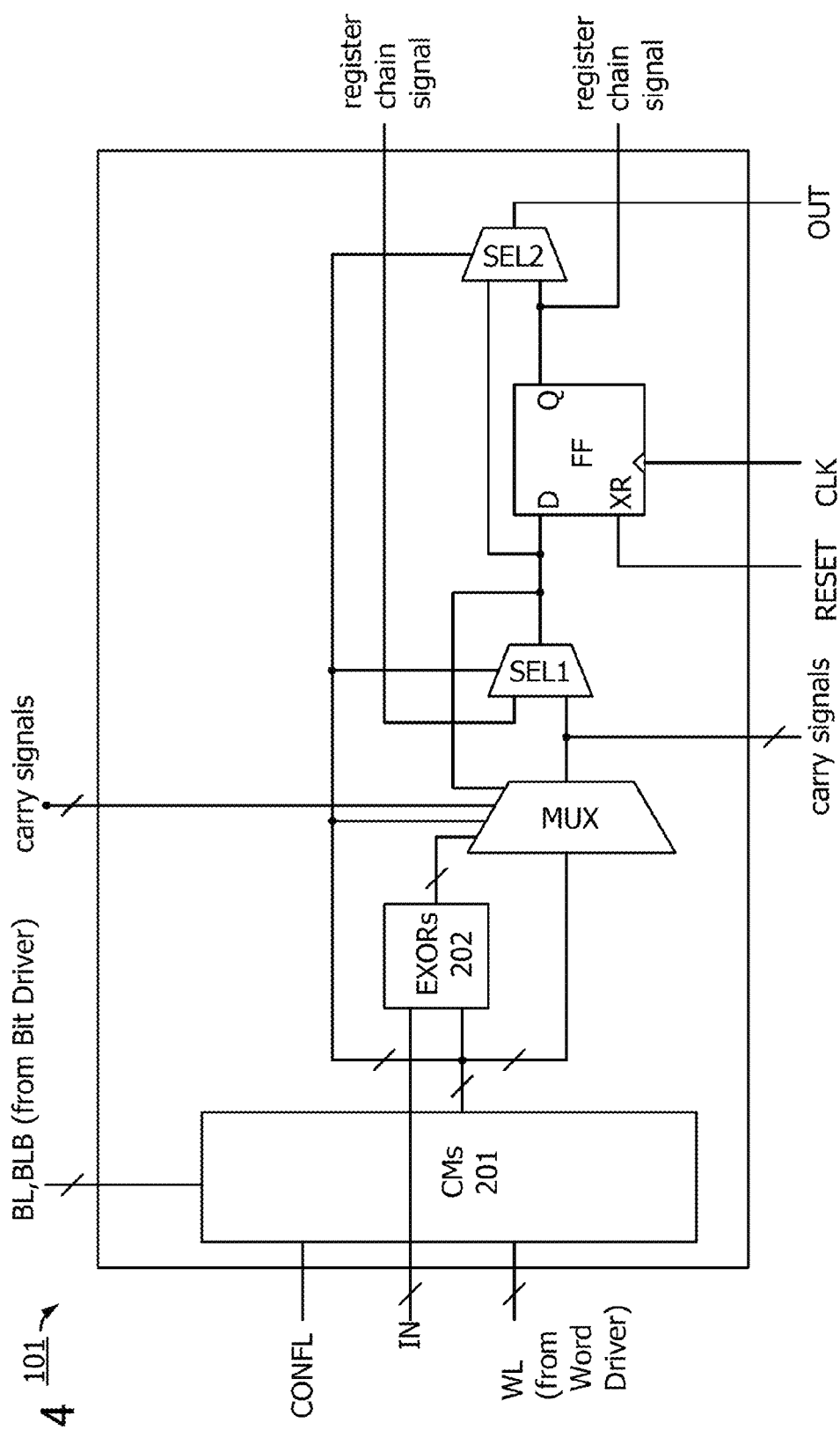
FIG. 4 is a block diagram illustrating one embodiment of the present invention.

An example of a structure of a PLE is described. FIG. 4 is a block diagram of a PLE.

The PLE 101 in FIG. 4 includes a configuration memory portion (configuration memories (CM)) 201, an exclusive OR circuit (EXORs) 202, a multiplexer MUX, a selector SEL 1, a flip-flop FF, and a selector SEL 2.

The configuration memory portion 201 is connected to a wiring (WL) to which a word signal is input and a wiring (BL or BLB) to which a data signal data or datab is input. The configuration memory portion 201 is connected to a wiring to which a configuration state signal is input. A plurality of configuration memories CM described in Embodiment 1 are provided in the configuration memory portion 201.

The configuration memory portion 201 has a function of changing a circuit configuration by switching signals output to the exclusive OR circuit 202 (EXORs), the multiplexer MUX, the selector SEL1, the flip-flop FF, and the selector SEL2.

Signals (carry signals or register chain signals) for forming a carry chain or a register chain are input and output between the adjacent PLEs 101 in accordance with circuit configuration change.

To the exclusive OR circuit 202, an input signal is input from an input terminal IN and an output signal out for changing the function of the PLE is input from the configuration memory portion 201. The signals obtained in the exclusive OR circuit 202 are output to the multiplexer MUX.

To the multiplexer MUX, the output signal out for changing the function of the PLE is input from the configuration memory portion 201, and the signal output from the exclusive OR circuit 202, the signal for forming a carry chain, and a signal selected by the selector SEL1 are input. The signals obtained in the multiplex MUX are output to the selector SEL1

The signal for forming a register chain and the signals output from the multiplexer MUX are input to the selector SEL1 A signal selected by the selector SEL1 is output as a signal to be input to a terminal D of the flip-flop FF and the selector SEL2.

The signal output from the selector SEL1 and a signal output from a terminal Q of the flip-flop FF are input to the selector SEL2. A signal selected by the selector SEL2 is output as an output signal from an output terminal OUT.

The flip-flop FF functions as a register. The flip-flop FF includes the terminal D to which data is input, a terminal XR to which a reset signal RESET is input, a terminal to which a clock signal CLK is input, and the terminal Q from which data is output.

<Example of Structure of Configuration Memory Portion>

Figure 5:
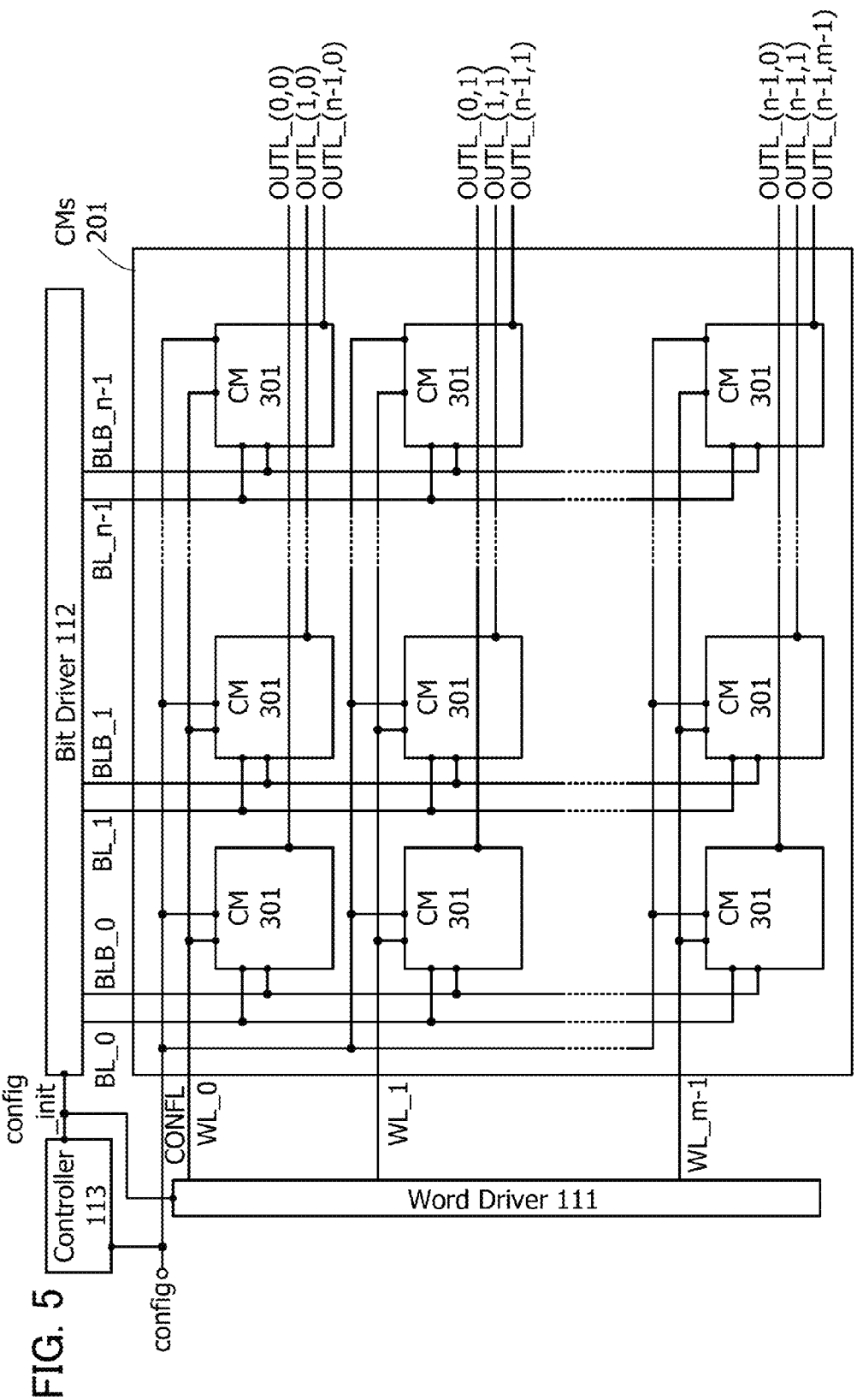
FIG. 5 is a block diagram illustrating one embodiment of the present invention.
Figure 21:
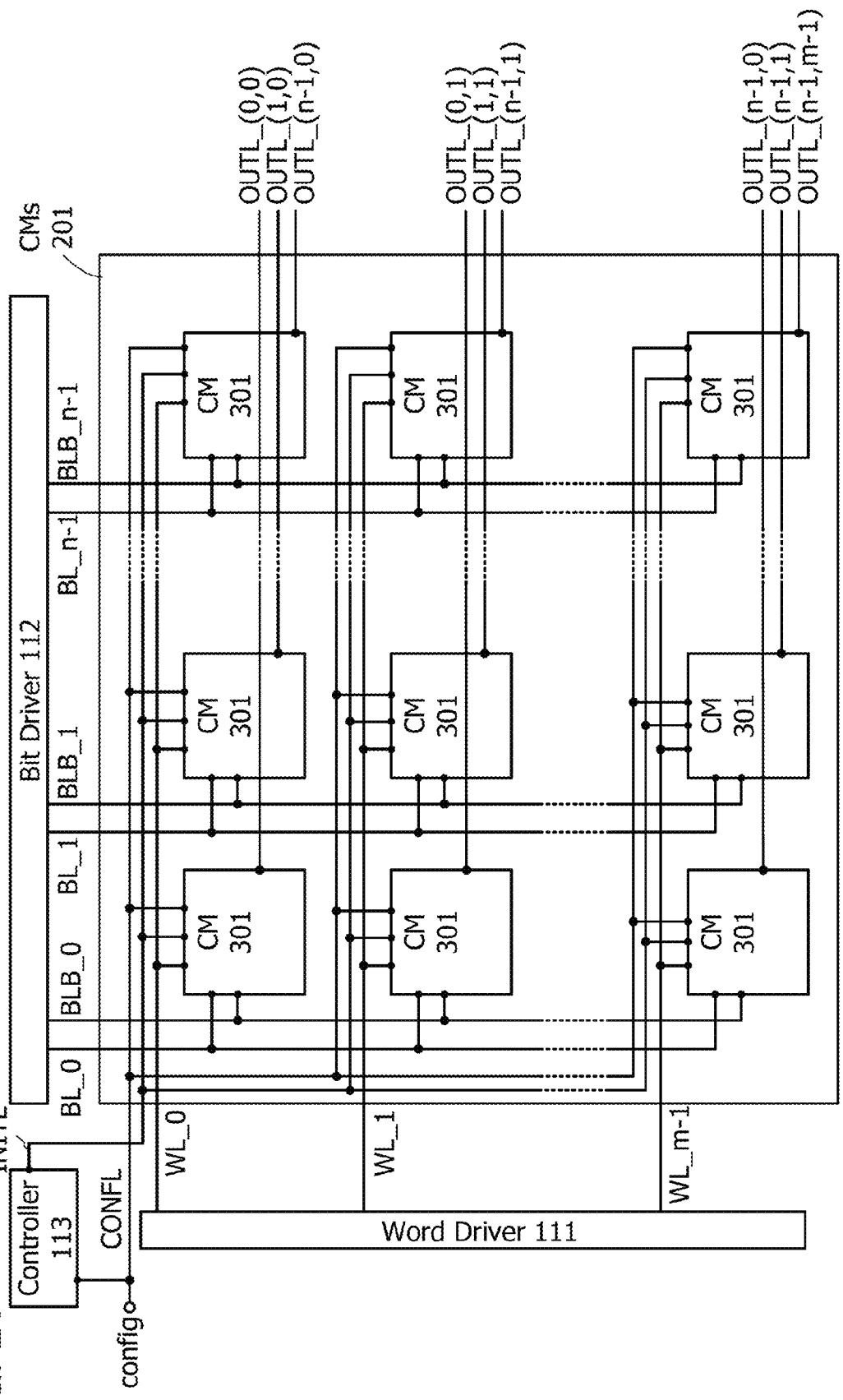
FIG. 21 is a block diagram illustrating one embodiment of the present invention.

An example of a structure of the configuration memory portion is described. FIG. 5 and FIG. 21 are block diagrams illustrating examples of the configuration memory portion. Note that only parts in FIG. 21 that differ from those in FIG. 5 are described and the same parts between FIG. 5 and FIG. 21 are not described.

The configuration memory portion 201 in each of FIG. 5 and FIG. 21 includes a plurality of configuration memories 301. In each of FIG. 5 and FIG. 21, the plurality of configuration memories 301 are arranged in m rows and n columns (m and n are each a natural number of 2 or more). Each of the configuration memories 301 is connected to wirings WL_0 to WL_m−1 connected to the word line driver circuit 111 and wirings BL_0 to BL_n−1 and BLB_0 to BLB n−1 connected to the bit line driver circuit 112 to control writing of configuration data. Each of the configuration memories 301 is connected to a wiring CONFL to be supplied with a configuration state signal config. A signal for changing the function of the PLE is input to wirings OUTL (0,0) to OUTL(n−1,m−1) in response to the written configuration data.

The control circuit 113 in FIG. 5 is connected to the wiring CONFL to be supplied with the configuration state signal config. The control circuit 113 outputs a configuration initialization signal config_init to the word line driver circuit 111 and the bit line driver circuit 112 in response to the configuration state signal config. The configuration initialization signal config_init has a function of performing initialization operation in each of the configuration memories 301.

The control circuit 113 in FIG. 21 is connected to the wiring CONFL to be supplied with the configuration state signal config. The control circuit 113 outputs a configuration initialization signal config_init to a wiring INITL in response to the configuration state signal config.

Each of the configuration memories 301 is connected to the wiring CONFL and the wiring INITL to be supplied with the configuration state signal config and the configuration initialization signal config_init. The configuration initialization signal config_init has a function of performing initialization operation in each of the configuration memories 301.

Figure 6:
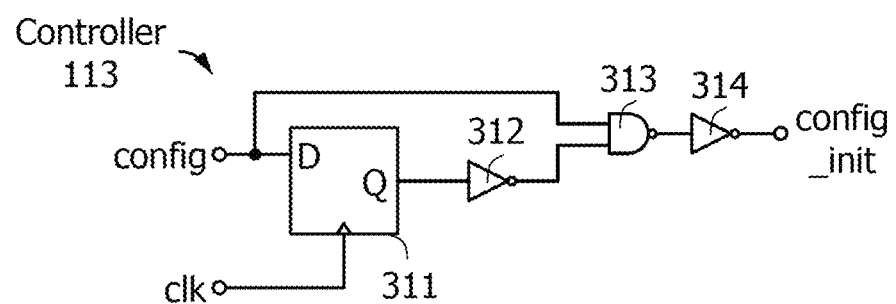
FIG. 6 is a circuit diagram illustrating one embodiment of the present invention.

FIG. 6 illustrates an example of a configuration of the control circuit 113. The control circuit 113 in FIG. 6 includes a flip-flop circuit 311, an inverter circuit 312, a NAND circuit 313, and an inverter circuit 314.

A configuration state signal config passes through the flip-flop synchronized with a clock signal clk to generate a configuration state signal config that is delayed by one cycle of the clock signal clk. By negative AND of the delayed configuration state signal config and the original configuration state signal config, a configuration initialization signal config_init that is used as a pulse signal having a width of a period corresponding to one cycle of the clock signal clk can be generated while the configuration state signal config has an H-level potential. Note that in the case where the configuration state signal config is asynchronous with the clock signal clk, the flip-flop circuit 311 may be added so that the configuration state signal config is input to the control circuit 113 as a signal that is synchronized with the clock signal clk. The above structure allows generation of the configuration initialization signal config_init that has a width of a period corresponding to one cycle of the clock signal clk.

Operation of the configuration memory portion 201 in each of FIG. 5 and FIG. 21 and operation of the control circuit 113 in FIG. 6 are described with reference to a timing chart of FIG. 7.

Figure 7:
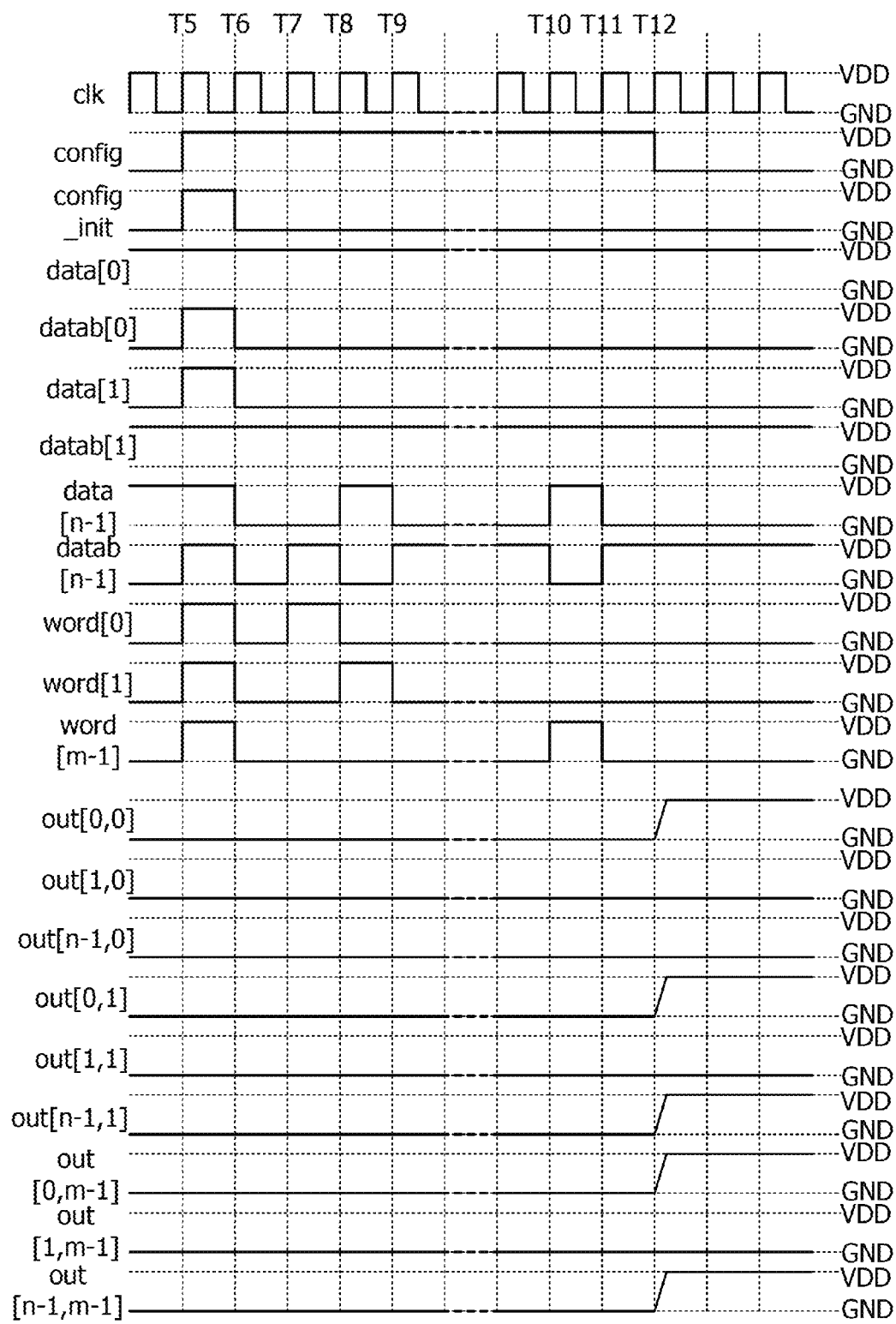
FIG. 7 is a timing chart illustrating one embodiment of the present invention.

FIG. 7 shows changes of the clock signal clk, the configuration state signal config, and the configuration initialization signal config_init that are shown in FIG. 6, and a data signal data[0], a data signal data[1], a data signal data[n−1], a data signal datab[0], a data signal datab [1], a data signal datab[n−1], a word signal word[0], a word signal word[1], a word signal word[m−1], an output signal out[0,0], an output signal out out[1,0], an output signal out[n−1,0], an output signal out[0,1], an output signal out[1,1], an output signal out[n−1,1], an output signal out[0,m−1], an output signal out[1,m−1], and an output signal out[n−1,m−1] that are shown in FIG. 5. Note that for convenience of explanation, the timings at which signals are changed are denoted by Time T5 to Time T12 in FIG. 7.

Each of the signals shown in FIG. 7 is binary data "0" or "1", and is described using a potential VDD and a potential GND as an H-level potential and an L-level potential, respectively, for convenience.

First, initialization operation is started at Time T5. When the configuration state signal config is set at H level at Time T5, the configuration initialization signal config_init is set at H level. When the configuration initialization signal config_init is set at H level, the word signals word[0] to word[m−1] are set at H level, and the data signals data[0] to data[n−1] and the data signal datab[0] to data[n−1] are set at H level. As a result, the potentials of nodes N1 and N2 are at H level and the potential of node N3 is at L level in each configuration memory 301 as described with reference to FIG. 2.

The initialization operation is completed at Time T6. When the potential of the configuration initialization signal config_init is set at L level at Time T6, the potentials of the word signals word[0] to word[m−1], the data signal datab [0], the data signal datab[1], and the data signal datab[n−1] are set at L level. Thus, the potentials of the nodes N1, N2, and N3 and the wirings OUTL[0,0] to OUTL[n−1,m−1] are maintained in each configuration memory 301 as described with reference to FIG. 2.

At Time T7, writing operation of configuration data is started. At Time T7, configuration data starts to be written to the nodes N1 and N2 of the configuration memory 301 selected by the word signal word[0]. When the potential of the word signal word[0] is set at H level, the potentials of the data signals data[0] to data[n−1] and the potentials of the data signals datab[0] to datab[n−1], which are configuration data, are input to the nodes N1 and N2.

At Time T8, the writing operation of the configuration data to the nodes N1 and N2 of the configuration memory 301 selected by the word signal word[0] is completed. At Time T8, the writing operation of the configuration data to the nodes N1 and N2 of the configuration memory 301 selected by the word signal word[0] is completed, and then configuration data starts to be written to nodes N1 and N2 of the configuration memory 301 selected by the word signal word[1]. When the potential of the word signal word[1] is set at H level, the potentials of the data signals data[0] to data[n−1] and the data signal datab[0] to datab[n−1], which are configuration data, are input to the nodes N1 and N2.

At Time T9, the writing operation of the configuration data to the nodes N1 and N2 of the configuration memory 301 selected by the word signal word[1] is completed.

At Time T10, configuration data starts to be written to nodes N1 and N2 of the configuration memory 301 selected by the word signal word[m−1]. When the potential of the word signal word[m−1] is set at H level, the potentials of the data signals data[0] to data[n−1] and the data signals datab[0] to datab[n−1], which are configuration data, are input to the nodes N1 and N2.

At Time T11, the writing operation of the configuration data to the nodes N1 and N2 of the configuration memory 301 selected by the word signal word[m−1] is completed.

At Time T12, the operation for setting the configuration data is completed. The potential of the configuration state signal config is set at L level, so that the potential of the node N3 is set at H level.

At Time T12, in the configuration memory 301 from which the output signals out[0,0], out[n−1,1], out[0,1], out[0,m−1], and out[n−1,m−1] are output, the potential of the node N1 is set at H level, the potential of the node N2 is set at L level, and the potential of the wiring OUTL is set at H level. When the potentials of the node N3 and the wiring OUTL increase, the potential of the node N1 increases because of boosting operation.

The boosting operation allows the potential of the node N1 to be much higher than an H-level potential. When the potential of the node N1 increases to be higher than the potential VDD that is an H-level potential, a decrease in potential by the amount of threshold voltage of a transistor NT1 that is a path transistor does not occur. As a result, the potential of the wiring VL does not decrease and can be output as the output signal out.

In contrast, in the configuration memory 301 from which the output signals out[1,0], out[1,1], out[n−1,0], and out[1,m−1] are output, the potential of the node N1 is set at L level, the potential of the node N2 is set at H level, and the wiring OUTL is set at L level at Time T12.

<Example of Structure of PSE>

Figure 8A:
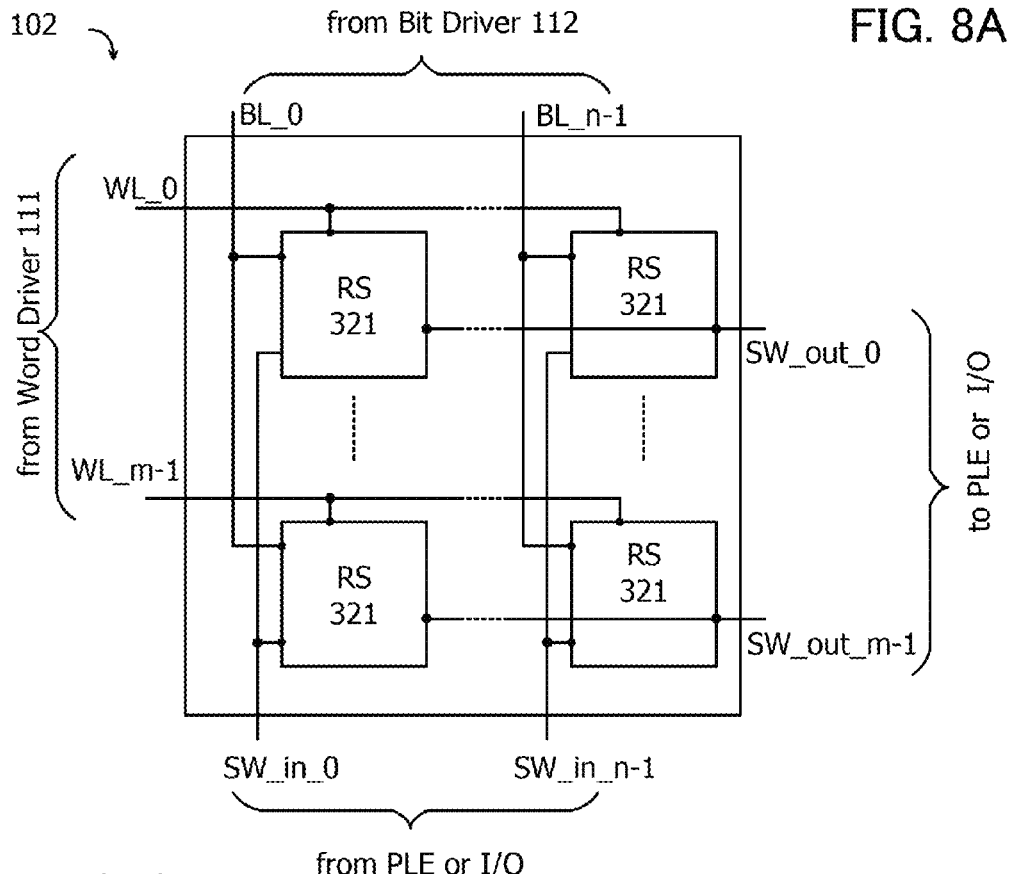
FIGS. 8A and 8B are a block diagram and a circuit diagram, respectively, illustrating one embodiment of the present invention.

An example of a structure of the PSE is described. FIG. 8A is a block diagram illustrating an example of the PSE.

The PSE 102 illustrated in FIG. 8A includes a plurality of routing switches (RS) 321. In FIG. 8A, the plurality of routing switches 321 are arranged in m rows and n columns (m and n are each a natural number of 2 or more). The routing switches 321 are connected to the wirings WL_0 to WL_m−1, wirings BL_0 to BL_n−1, input lines SW_in_0 to SW_in_n−1, and output lines SW_out_0 to SW_out_m−1, whereby writing of configuration data and electrical continuity between the input lines and the output lines are controlled.

Figure 8B:
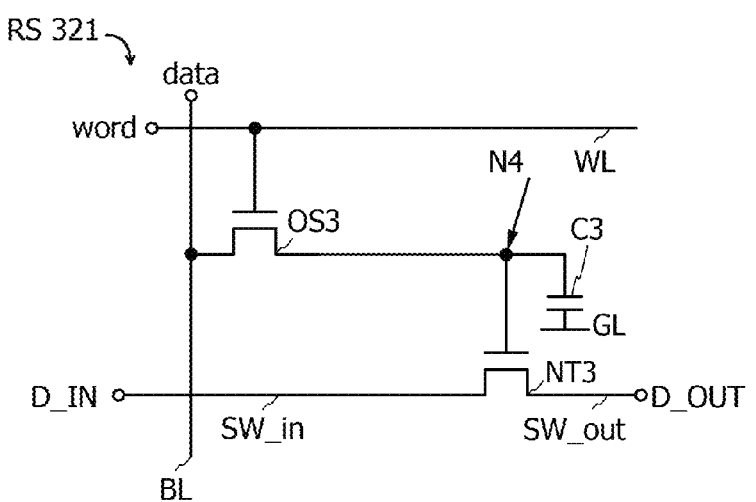

FIG. 8B illustrates a specific circuit configuration of the routing switch 321 illustrated in FIG. 8A.

The routing switch 321 includes a transistor OS3, a transistor NT3, and a capacitor C3.

In FIG. 8B, one of a source and a drain of the transistor OS3 is illustrated as a node N4.

The wiring WL for inputting a word signal word, the wiring BL for inputting a data signal data, the input line SW_in for inputting an input signal D_IN, and the output line SW_out for inputting an output signal D_out are illustrated in the routing switch 321 in FIG. 8B.

A gate of the transistor OS3 is connected to the wiring WL and the other of the source and the drain of the transistor OS3 is connected to the wiring BL. Like the transistors OS1 and OS2 described in Embodiment 1, the transistor OS3 is preferably a transistor with low off-state current.

In the routing switch 321 in FIG. 8B, configuration data is written and retained by controlling the conduction state of the transistor OS3. Thus, it is particularly preferable to use a transistor with low off-state current as a switch for suppressing a potential change caused by the electric charge transfer in the node N4 while a potential corresponding to the configuration data is retained in the node N4.

By using a transistor with low off-state current as the transistor OS3, the routing switch 321 can be used as a nonvolatile memory that retains data after power supply is stopped. By setting the potential of the word signal word at L level, the node N4 is in an electrically floating state and retains a potential corresponding to the written configuration data. Thus, the node N4 can function as a memory circuit that retains the configuration data thereafter.

Note that in the case where the node N4 retains a potential for turning on the transistor NT3 when the potential of the input signal D_IN changes from L level to H level, a boosting effect can be obtained by generating capacitive coupling between the transistor NT3 and the node N4.

A gate of the transistor NT3 is connected to the one of the source and the drain of the transistor OS3 and one of a source and a drain of the transistor NT3 is connected to the input line SW_in, and the other of the source and the drain is connected to the output line SW_out. Like the transistors NT1 and NT2 described in Embodiment 1, the transistor NT3 is preferably a transistor using silicon in a semiconductor layer in which a channel is formed. Note that although the transistor NT3 in FIG. 8B is described as an n-channel transistor, the transistor NT3 can be a p-channel transistor.

One electrode of the capacitor C3 is connected to the gate of the transistor NT3. The other electrode of the capacitor C3 is connected to a wiring GL.

Note that the capacitor C3 does not need to be provided when the gate capacitance of the transistors NT1 and NT2 is increased. Although the other electrode of the capacitor C3 is connected to the wiring GL in FIG. 8B, it may be connected to another wiring.

This embodiment can be implemented in appropriate combination with any of the other embodiments.

(Embodiment 3)

In this embodiment, an oxide semiconductor layer that can be used as the semiconductor layer of the transistor with low off-state current described in the above embodiment is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, or 2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1 \times 10^{17}/cm^3$ or lower, $1 \times 10^{16}/cm^3$ or lower, $1 \times 10^{15}/cm^3$ or lower, $1 \times 10^{14}/cm^3$ or lower, or $1 \times 10^{13}/cm^3$ or lower, particularly preferably lower than $8 \times 10^{11}/cm^3$, still further preferably lower than $1 \times 10^{11}/cm^3$, yet further preferably lower than $1 \times 10^{10}/cm^3$, and is $1 \times 10^{-9}/cm^3$ or higher.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1 \times 10^{-18}$ A, preferably less than or equal to $1 \times 10^{-21}$ A, and further preferably less than or equal to $1 \times 10^{-24}$ A; or at 85° C., less than or equal to $1 \times 10^{-15}$ A, preferably less than or equal to $1 \times 10^{-18}$ A, further preferably less than or equal to $1 \times 10^{-21}$ A. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), an oxide semiconductor having a microcrystalline structure (hereinafter referred to as a microcrystalline oxide semiconductor), and an oxide semiconductor having an amorphous structure (hereinafter referred to as an amorphous oxide semiconductor). Alternatively, the oxide semiconductor film may include a CAAC-OS. Alternatively, the oxide semiconductor film may include an amorphous oxide semiconductor and an oxide semiconductor having a crystal grain. Described below are a CAAC-OS and a microcrystalline oxide semiconductor as typical examples.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 10A is a cross-sectional TEM image of a CAAC-OS film. FIG. 10B is a cross-sectional TEM image obtained by enlarging the image of FIG. 10A. In FIG. 10B, atomic arrangement is highlighted for easy understanding.

FIG. 10C is Fourier transform images of regions each surrounded by a circle (the diameter is approximately 4 nm) between A and O and between O and A' in FIG. 10A. C-axis alignment can be observed in each region in FIG. 10C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 11A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2q fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 28 fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CA;1AC-OS film varies depending on regions, in some cases.

Note that when the CAAC-OS film with an $InGaZnO_4$ crystal is analyzed by an out-of-plane method, a peak of 28 may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 11B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 11A:
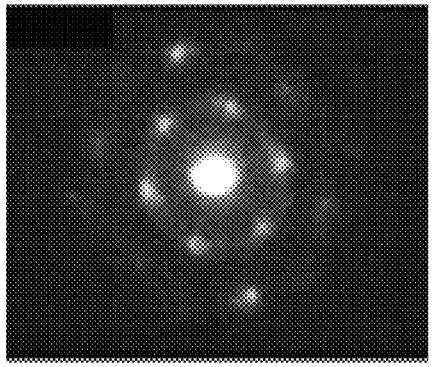
FIGS. 11A and 11B show nanobeam electron diffraction patterns of oxide semiconductor films.
Figure 11B:
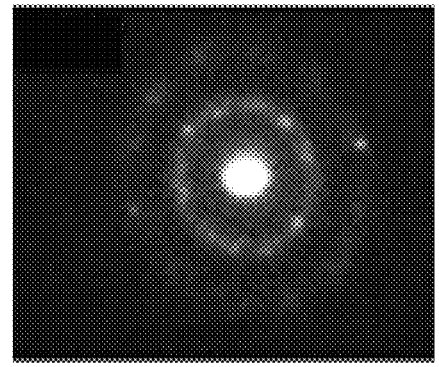
Figure 11C:
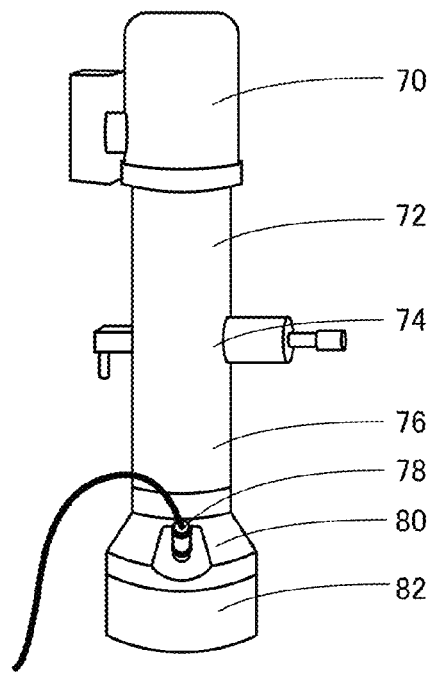
FIGS. 11C and 11D illustrate an example of a transmission electron diffraction measurement apparatus.

FIG. 11C illustrates a transmission electron diffraction measurement apparatus. The transmission electron diffraction measurement apparatus includes an electron gun chamber 70, an optical system 72 below the electron gun chamber 70, a sample chamber 74 below the optical system 72, an optical system 76 below the sample chamber 74, an observation chamber 80 below the optical system 76, a camera 78 provided for the observation chamber 80, and a film chamber 82 below the observation chamber 80. The camera 78 is provided to face toward the inside of the observation chamber 80. Note that the film chamber 82 is not necessarily provided.

Figure 11D:
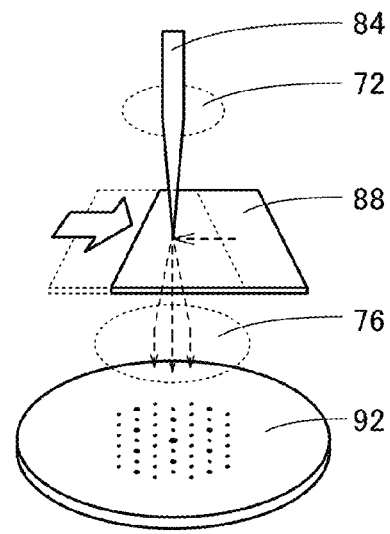

FIG. 11D illustrates the internal structure of the transmission electron diffraction measurement apparatus in FIG. 11C. In the transmission electron diffraction measurement apparatus, a substance 88 which is positioned in the sample chamber 74 is irradiated with electrons emitted from an electron gun installed in the electron gun chamber 70 through the optical system 72. The electrons which have passed through the substance 88 enter a fluorescent plate 92 which is installed in the observation chamber 80 through the optical system 76. On the fluorescent plate 92, a pattern corresponding to the intensity of the incident electron appears, which enables measurement of a transmission electron diffraction pattern.

The camera 78 is installed so as to face the fluorescent plate 92 and can take a picture of a pattern appearing in the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 88.

Then, a method for measuring a transmission electron diffraction pattern of a substance by the transmission electron diffraction measurement apparatus described above is described.

For example, changes in the structure of a substance can be observed by changing the irradiation position of the electrons 84 that are a nanobeam on the substance (or by scanning) as illustrated in FIG. 11D. At this time, when the substance 88 is a CAAC-OS film, a diffraction pattern shown in FIG. 11A is observed. When the substance 88 is an nc-OS film, a diffraction pattern shown in FIG. 11B is observed Even when the substance 28 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 12A:
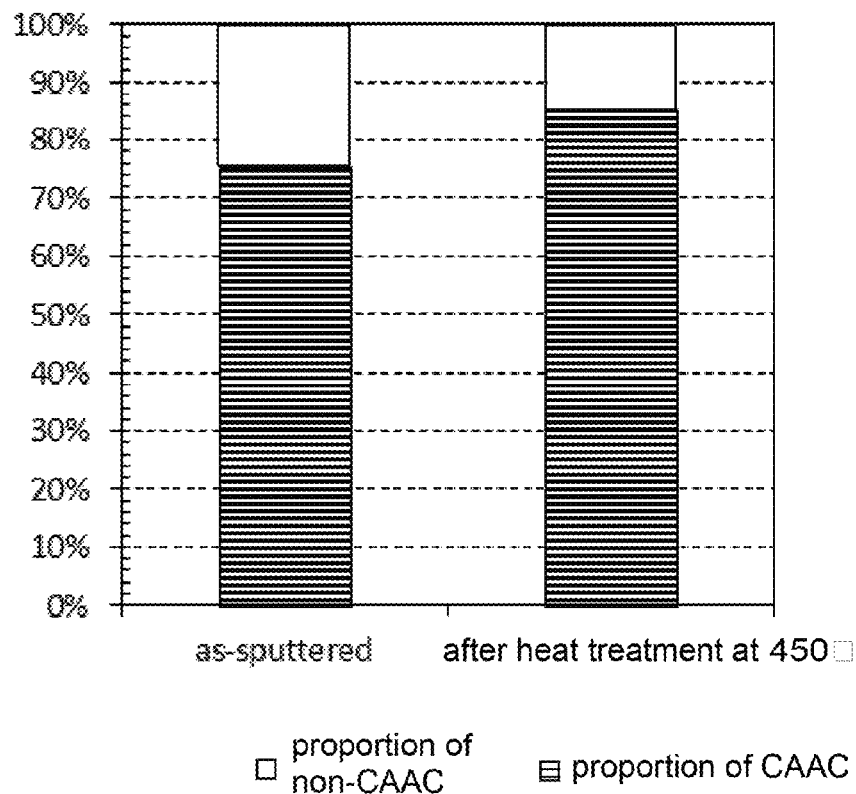
FIG. 12A shows an example of structural analysis by transmission electron diffraction measurement.

FIG. 12A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 12B:
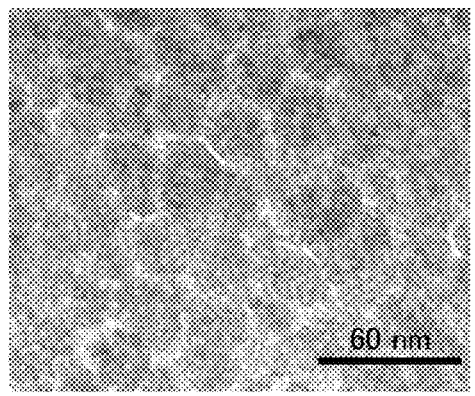
FIGS. 12B and 12C show plan-view TEM images.
Figure 12C:
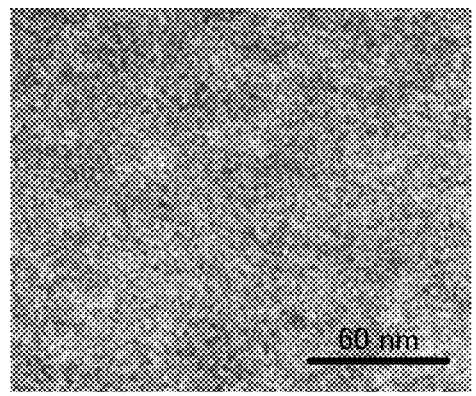

FIGS. 12B and 12C are plan-view TEM images of the CAAC-OS film obtained just after the deposition and the CAAC-OS film subjected to the heat treatment at 450° C., respectively. Comparison between FIGS. 12B and 12C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be combined as appropriate with any of the structures, methods, and the like described in the other embodiments.

(Embodiment 4)

In this embodiment, an example of a cross-sectional structure of a transistor used in a semiconductor device of one embodiment of the disclosed invention is described with reference to drawings.

Figure 13:
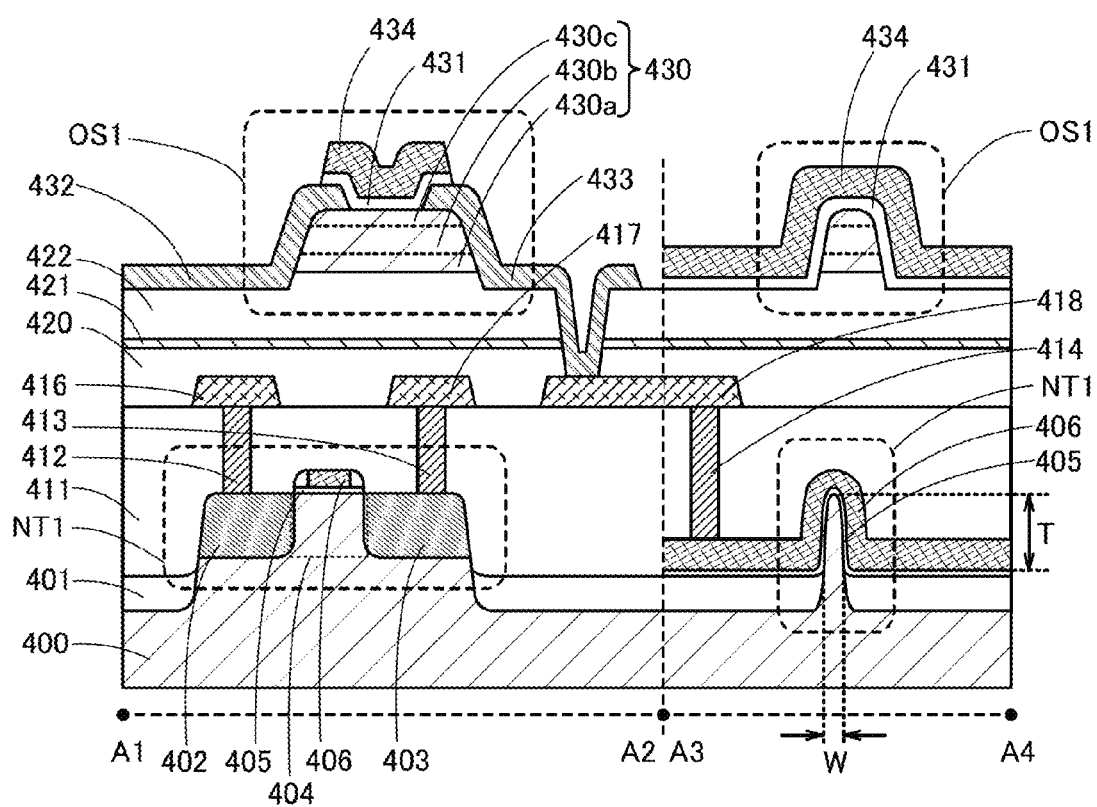
FIG. 13 is a cross-sectional view illustrating one embodiment of the present invention.

FIG. 13 illustrates an example of part of a cross-sectional structure of a circuit portion according to one embodiment of the disclosed invention. FIG. 13 illustrates examples of cross-sectional structures of the transistor OS1 and the transistor NT1 illustrated in FIG. 1 in Embodiment 1. A region along dashed line A1-A2 shows structures of the transistors OS1 and NT1 in the channel length direction, and a region along dashed line A3-A4 shows structures of the transistors OS1 and NT1 in the channel width direction. Note that in one embodiment of the present invention, the channel length direction of the transistor OS1 does not necessarily correspond to the channel length direction of the transistor NT1.

The channel length direction denotes a direction in which carriers move at the shortest distance between a pair of impurity regions serving as a source region and a drain region. The channel width direction denotes a direction perpendicular to the channel length direction.

FIG. 13 illustrates an example in which the transistor OS1 including a channel formation region in an oxide semiconductor film is formed over the transistor NT1 including a channel formation region in a single crystal silicon substrate.

The transistor NT1 may include a channel formation region in a semiconductor film or a semiconductor substrate of silicon, germanium, or the like in an amorphous, microcrystalline, polycrystalline, or single crystal state. Alternatively, the transistor NT1 may include the channel formation region in an oxide semiconductor film or an oxide semiconductor substrate. In the case where the transistors each include a channel formation region in an oxide semiconductor film or an oxide semiconductor substrate, the transistor OS1 is not necessarily stacked over the transistor NT1, and the transistors OS1 and NT1 may be formed in the same layer.

In the case where the transistor NT1 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor NT1 is formed can be, for example, a silicon substrate, a germanium substrate, or a silicon germanium substrate. In FIG. 13, a single crystal silicon substrate is used as the substrate 400.

The transistor NT1 is electrically isolated by element isolation. Trench isolation (e.g., shallow trench isolation (STI)) or the like can be used as the element isolation. In FIG. 13, the transistor NT1 is electrically isolated by trench isolation. Specifically, in FIG. 13, the transistor NT1 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor NT1 and a channel formation region 404 placed between the impurity regions 402 and 403 are provided. The transistor NT1 also includes an insulating film 405 covering the channel formation region 404 and a gate electrode 406 that overlaps the channel formation region 404 with the insulating film 405 placed therebetween.

In the transistor NT1, a side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the area of the transistor NT1 in the substrate can be small, and the amount of transfer of carriers in the transistor NT1 can be increased. As a result, the on-state current and field-effect mobility of the transistor NT1 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor NT1 can be further increased and the field-effect mobility of the transistor NT1 can be further increased.

Note that in the case of the transistor NT1 formed using a bulk semiconductor substrate, the aspect ratio is preferably 0.5 or more, more preferably 1 or more.

An insulating film 411 is provided over the transistor NT1. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor OS1 is provided over the insulating film 422.

The transistor OS1 includes, over the insulating film 422, a semiconductor film 430 including an oxide semiconductor, conductive films 432 and 433 functioning as a source and drain electrodes and electrically connected to the semiconductor film 430, a gate insulating film 431 covering the semiconductor film 430, and a gate electrode 434 overlapping with the semiconductor film 430 with the gate insulating film 431 therebetween. Note that an opening is formed in the insulating films 420 to 422. The conductive film 433 is connected to the conductive film 418 in the opening.

Note that in FIG. 13, the transistor OS1 includes at least the gate electrode 434 on one side of the semiconductor film 430, and may further include a gate electrode overlapping with the semiconductor film 430 with the insulating film 422 therebetween.

When the transistor OS1 includes a pair of gate electrodes, a signal for controlling an on state or an off state may be input to one of the gate electrodes, and the other of the gate electrodes may be supplied with a potential from another element. In that case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 13, the transistor OS1 has a single-gate structure in which one channel formation region corresponding to one gate electrode 434 is provided. However, the transistor OS1 may have a multi-gate structure where a plurality of electrically connected gate electrodes are provided so that a plurality of channel formation regions are included in one active layer.

FIG. 13 illustrates an example in which the semiconductor film 430 included in the transistor OS1 includes oxide semiconductor films 430a to 430c that are stacked in this order over the insulating film 422. Note that in one embodiment of the present invention, the semiconductor film 430 of the transistor OS1 may be formed using a single-layer metal oxide film.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor OS1 illustrated in FIG. 13, the gate electrode 434 overlaps end portions of the oxide semiconductor film 430b including a channel region that are not overlapped with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that are not overlapped with the conductive films 432 and 433 are overlapped with the gate electrode 434 in the transistor OS1 illustrated in FIG. 13. Consequently, current that flows between the conductive films 432 and 433 through the end portions of the oxide semiconductor film 430b can be controlled by the potential applied to the gate electrode 434. This structure of the transistor OS1 is referred to a surrounded channel (s-channel) structure.

With the s-channel structure, specifically, when a potential at which the transistor OS1 is turned off is supplied to the gate electrode 434, the amount of off-state current that flows between the conductive films 432 and 433 through the end portions can be reduced. For this reason, in the transistor OS1, even when the distance between the conductive films 432 and 433 at the end portions of the oxide semiconductor film 430b is reduced as a result of reducing the channel length to obtain high on-state current, the transistor OS1 can have low off-state current. Consequently, with the short channel length, the transistor OS1 can have high on-state current when in an on state and low off-state current when in an off state.

With the s-channel structure, specifically, when a potential at which the transistor OS1 is turned on is supplied to the gate electrode 434, the amount of current that flows between the conductive films 432 and 433 through the end portions of the oxide semiconductor film 430b can be increased. The current contributes to an increase in the field-effect mobility and on-state current of the transistor OS1. When the end portions of the oxide semiconductor film 430b are overlapped with the gate electrode 434, carriers flow in a wide region of the oxide semiconductor film 430b without being limited to a region in the vicinity of the interface between the oxide semiconductor film 430b and the gate insulating film 431, which results in an increase in carrier mobility the transistor OS1. As a result, the on-state current of the transistor OS1 is increased, and the field-effect mobility is increased. Typically, the field-effect mobility is greater than or equal to 10 $cm^2/V \cdot s$ or greater than or equal to 20 $cm^2/V \cdot s$. Note that here, the field-effect mobility is not an approximate value of the mobility as the physical property of the oxide semiconductor film but is an index of current drive capability and the apparent field-effect mobility of a saturation region of the transistor.

Figure 14:
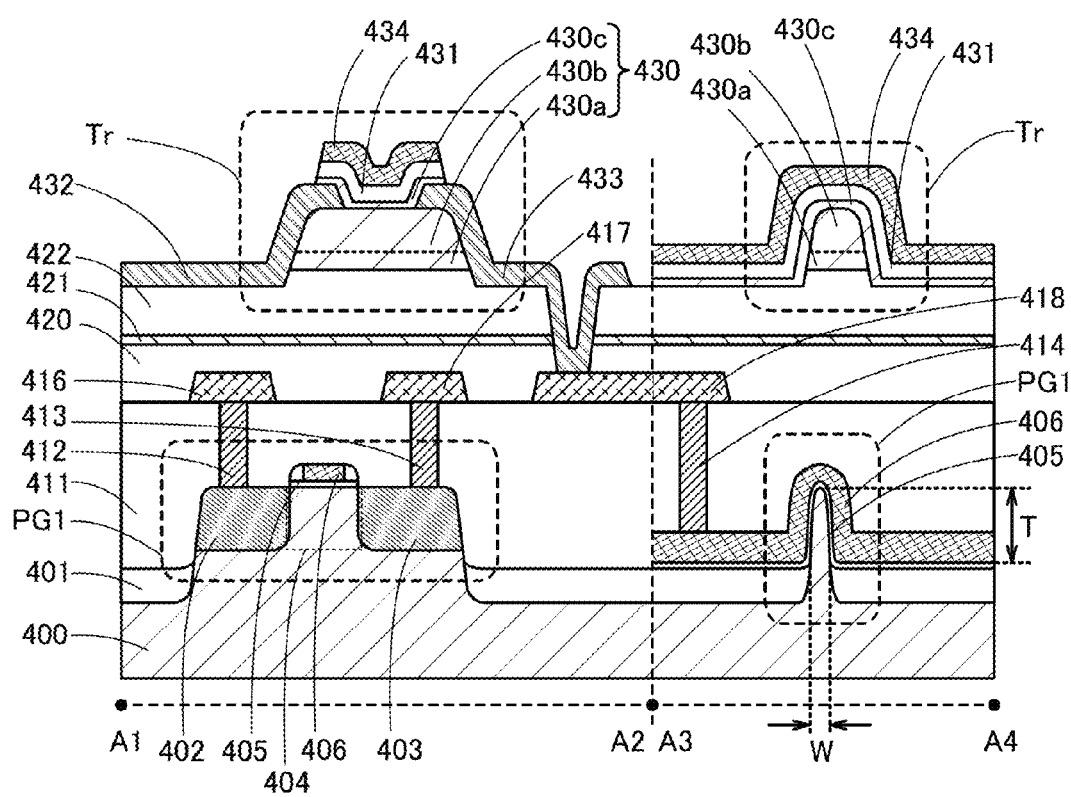
FIG. 14 is a cross-sectional view illustrating one embodiment of the present invention.

Although this embodiment is described with reference to FIG. 13, one embodiment of the present invention is not limited to this structure. For example, a structure illustrated in FIG. 14 may be employed.

Note that the structures, methods, and the like described in this embodiment can be combined as appropriate with any of the structures, methods, and the like described in the other embodiments.

(Embodiment 5)

Although the conductive film and the semiconductor film described in the above embodiments can be formed by a sputtering method, they may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film and the semiconductor film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example.

A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn (CH$_3$)$_2$ gas may be used.

The structure described above in this embodiment can be combined as appropriate with any of the structures described in the other embodiments.

(Embodiment 6)

In this embodiment, application examples of the semiconductor device described in the above embodiments to an electronic component and to an electronic appliance including the electronic component are described with reference to FIGS. 15A and 15B and FIGS. 16A to 16E.

Figure 15A:
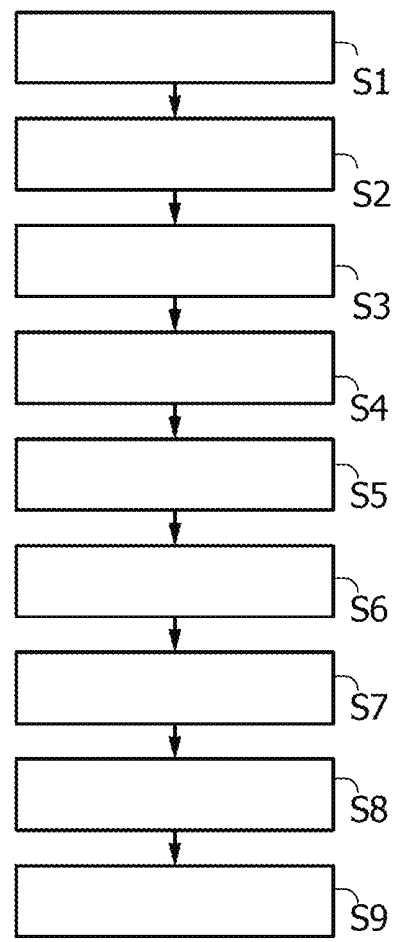
FIG. 15A is a flowchart showing a manufacturing process of an electronic component.

FIG. 15A shows an example where the semiconductor device described in the above embodiments is used to make an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors illustrated in FIG. 13 of Embodiment 4 is completed by integrating detachable components on a printed circuit board through the assembly process (post-process).

The post-process can be completed through steps shown in FIG. 15A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above electronic component can include the semiconductor device described in the above embodiments. Thus, the electronic component can consume less power and have a reduced size.

Figure 15B:
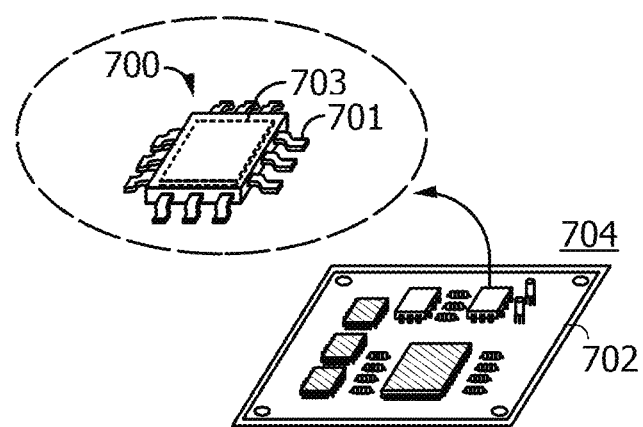
FIG. 15B is a schematic perspective view of the electronic component.

FIG. 15B is a schematic perspective view of the completed electronic component. FIG. 15B is a schematic perspective view illustrating a quad flat package (QFP) as an example of the electronic component. A lead 701 and a circuit portion 703 of an electronic component 700 are illustrated in FIG. 15B. The electronic component 700 in FIG. 15B is, for example, mounted on a printed wiring board 702. When a plurality of electronic components 700 are used in combination and electrically connected to each other over the printed wiring board 702, the electronic components 700 can be mounted on an electronic appliance. A completed circuit board 704 is provided in the electronic appliance or the like.

Then, applications of the electronic component to an electronic appliance such as a computer, a portable information terminal (including a mobile phone, a portable game machine, an audio reproducing device, and the like), electronic paper, a television device (also referred to as a television or a television receiver), or a digital video camera are described.

Figure 16A:
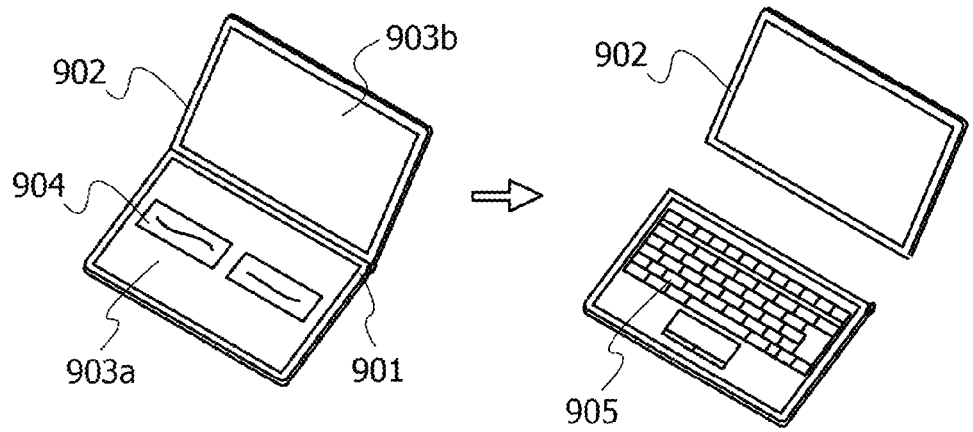
FIGS. 16A to 16E illustrate electronic appliances including electronic components.

FIG. 16A illustrates a portable information terminal, which includes a housing 901, a housing 902, a first display portion 903a, a second display portion 903b, and the like. An electronic component including the semiconductor device described in the above embodiments is provided in at least one of the housings 901 and 902. Thus, the portable information terminal can consume less power and have a reduced size.

Note that the first display portion 903a is a touch panel, and for example, as illustrated in the left of FIG. 16A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 16A. With the keyboard 905, letters can be input quickly by keyboard input as in the case of using a conventional information terminal, for example.

Furthermore, one of the first display portion 903a and the second display portion 903b can be detached from the portable information terminal as illustrated in the right in FIG. 16A. The second display portion 903b can also function as a touch panel for a reduction in weight to carry around to be operated by one hand while the other hand supports the housing 902, which is convenient.

The portable information terminal in FIG. 16A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 16A may transmit and receive data wirelessly. Through wireless communication, desired book data or the like can be purchased and downloaded from an electronic book server.

Furthermore, the housing 902 in FIG. 16A may have an antenna, a microphone function, or a wireless communication function to be used as a mobile phone.

Figure 16B:
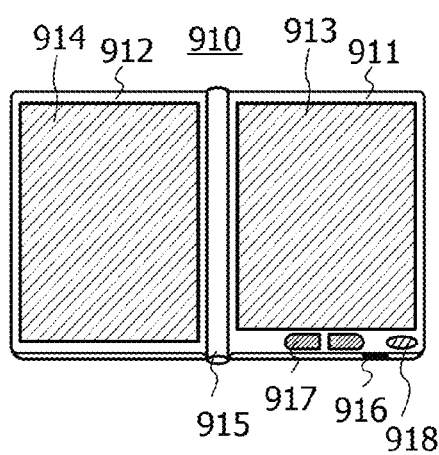

FIG. 16B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened and closed with the hinge portion 915 as an axis. The housing 911 is provided with a power switch 916, an operation key 917, a speaker 918, and the like. An electronic component including the semiconductor device is provided in at least one of the housings 911 and 912. Thus, the e-book reader can consume less power and have a reduced size.

Figure 16C:
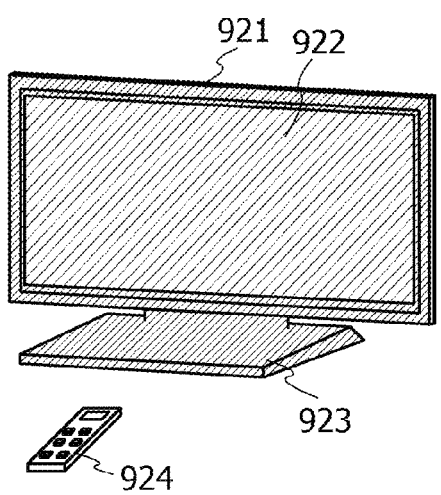

FIG. 16C is a television device, which includes a housing 921, a display portion 922, a stand 923, and the like. The television device 920 can operate with a switch of the housing 921 and a separate remote controller 924. An electronic component including the semiconductor device described in the above embodiments is provided in the housing 921 and the remote controller 924. Thus, the television device can consume less power and have a reduced size.

Figure 16D:
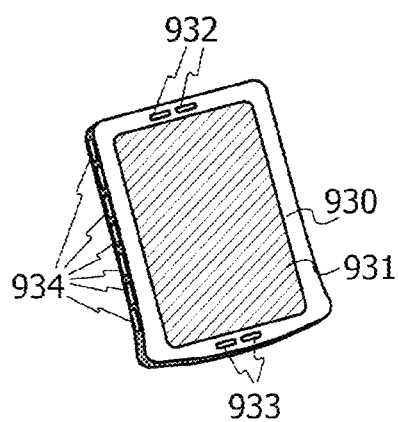

FIG. 16D illustrates a smartphone in which a main body 930 includes a display portion 931, a speaker 932, a microphone 933, operation buttons 934, and the like. An electronic component including the semiconductor device described in the above embodiments is provided in the main body 930. Thus, the smart phone can consume less power and have a reduced size.

Figure 16E:
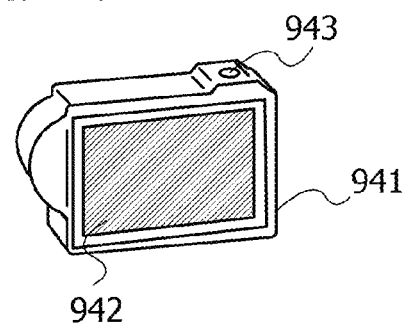

FIG. 16E illustrates a digital camera, which includes a main body 941, a display portion 942, an operation switch 943, and the like. An electronic component including the semiconductor device described in the above embodiments is provided in the main body 941. Thus, the digital camera can consume less power and have a reduced size.

As described above, an electronic component including the semiconductor device described in the above embodiments is provided in each of the electronic appliances described in this embodiment. Thus, the electronic appliances can consume less power and have a reduced size.

This application is based on Japanese Patent Application serial No. 2014-021024 filed with the Japan Patent Office on Feb. 6, 2014 and Japanese Patent Application serial No. 2014-021924 filed with the Japan Patent Office on Feb. 7, 2014, the entire contents of which are hereby incorporated by reference.

What is claimed is:

1. A semiconductor device comprising:
first to fifth transistors,
wherein a gate of the first transistor is electrically connected to a first wiring,
wherein one of a source and a drain of the first transistor is electrically connected to a second wiring,
wherein a gate of the second transistor is electrically connected to the first wiring,
wherein one of a source and a drain of the second transistor is electrically connected to a third wiring,
wherein a gate of the third transistor is electrically connected to the other of the source and the drain of the first transistor,
wherein a gate of the fourth transistor is electrically connected to the other of the source and the drain of the second transistor,
wherein a gate of the fifth transistor is electrically connected to a fourth wiring,
wherein one of a source and a drain of the fifth transistor is electrically connected to a fifth wiring,
wherein the other of the source and the drain of the fifth transistor is electrically connected to one of a source and a drain of the third transistor,
wherein one of a source and a drain of the fourth transistor is electrically connected to a sixth wiring,
wherein the other of the source and the drain of the third transistor is electrically connected to a seventh wiring,
wherein the other of the source and the drain of the fourth transistor is electrically connected to the seventh wiring,
wherein the first wiring is capable of transmitting a first signal,
wherein the second wiring is capable of transmitting a second signal,
wherein the third wiring is capable of transmitting a third signal,
wherein the fourth wiring is capable of transmitting a fourth signal,
wherein the fifth wiring is capable of transmitting an H-level potential,
wherein the sixth wiring is capable of transmitting an L-level potential,
wherein the seventh wiring is capable of transmitting a potential of the fifth wiring or a potential of the sixth wiring,
wherein the first signal is capable of controlling conduction states of the first transistor and the second transistor,
wherein the second signal is capable of controlling a conduction state of the third transistor,
wherein the third signal is capable of controlling a conduction state of the fourth transistor, and
wherein the fourth signal is capable of controlling a conduction state of the fifth transistor.

2. The semiconductor device according to claim 1,
wherein the first to fourth transistors are each an n-channel transistor, and
wherein the fifth transistor is a p-channel transistor.

3. The semiconductor device according to claim 1,
wherein the first and second transistors each comprise an oxide semiconductor in a semiconductor layer.

4. The semiconductor device according to claim 3,
wherein the third and fourth transistors each comprise an oxide semiconductor in a semiconductor layer.

5. The semiconductor device according to claim 1,
wherein while the fifth transistor is off, a potential of the first signal is set at H level and a potential of the second signal is set at H level in a first period, and the potential of the first signal is set at one of H level and L level and the potential of the second signal is set at the other of H level and L level in a second period.

6. An electronic component comprising:
the semiconductor device according to claim 1; and
a lead electrically connected to the semiconductor device.

7. An electronic appliance comprising:
the electronic component according to claim 6; and
a display device.

8. A semiconductor device comprising:
first to fifth transistors,
wherein a gate of the first transistor is electrically connected to a first wiring,
wherein one of a source and a drain of the first transistor is electrically connected to a second wiring, wherein a gate of the second transistor is electrically connected to the first wiring,
wherein one of a source and a drain of the second transistor is electrically connected to a third wiring,
wherein a gate of the third transistor is electrically connected to the other of the source and the drain of the first transistor,
wherein a gate of the fourth transistor is electrically connected to the other of the source and the drain of the second transistor,
wherein a gate of the fifth transistor is electrically connected to a fourth wiring,
wherein one of a source and a drain of the fifth transistor is electrically connected to a fifth wiring,
wherein the other of the source and the drain of the fifth transistor is electrically connected to one of a source and a drain of the third transistor,
wherein one of a source and a drain of the fourth transistor is electrically connected to a sixth wiring,
wherein the other of the source and the drain of the third transistor and the other of the source and the drain of the fourth transistor are electrically connected to a seventh wiring,
wherein the first wiring is capable of transmitting a first signal,
wherein the second wiring is capable of transmitting a second signal,
wherein the third wiring is capable of transmitting a third signal,
wherein the fourth wiring is capable of transmitting a fourth signal,
wherein the fifth wiring is capable of transmitting an H-level potential,
wherein the sixth wiring is capable of transmitting an L-level potential,
wherein the seventh wiring is capable of transmitting a potential of the fifth wiring or a potential of the sixth wiring, and
wherein the first to fourth signals are capable of setting the other of the source and the drain of the fifth transistor at L level by turning off the fifth transistor and turning on the third transistor and the fourth transistor and of setting the other of the source and the drain of the fifth transistor at H level by turning on the fifth transistor.

9. The semiconductor device according to claim 8,
wherein the first to fourth transistors are each an n-channel transistor, and
wherein the fifth transistor is a p-channel transistor.

10. The semiconductor device according to claim 8,
wherein the first and second transistors each comprise an oxide semiconductor in a semiconductor layer.

11. The semiconductor device according to claim 10,
wherein the third and fourth transistors each comprise an oxide semiconductor in a semiconductor layer.

12. The semiconductor device according to claim 8,
wherein while the fifth transistor is off, a potential of the first signal is set at H level and a potential of the second signal is set at H level in a first period, and the potential of the first signal is set at one of H level and L level and the potential of the second signal is set at the other of H level and L level in a second period.

13. An electronic component comprising:
the semiconductor device according to claim 8; and
a lead electrically connected to the semiconductor device.

14. An electronic appliance comprising:
the electronic component according to claim 13; and
a display device.

15. A semiconductor device comprising:
first to fifth transistors,
wherein a gate of the first transistor is electrically connected to a first wiring,
wherein one of a source and a drain of the first transistor is electrically connected to a second wiring,
wherein a gate of the second transistor is electrically connected to the first wiring,
wherein one of a source and a drain of the second transistor is electrically connected to a third wiring,
wherein a gate of the third transistor is electrically connected to the other of the source and the drain of the first transistor,
wherein a gate of the fourth transistor is electrically connected to the other of the source and the drain of the second transistor,
wherein a gate of the fifth transistor is electrically connected to a fourth wiring,
wherein one of a source and a drain of the fifth transistor is electrically connected to a fifth wiring,
wherein the other of the source and the drain of the fifth transistor is electrically connected to one of a source and a drain of the third transistor,
wherein one of a source and a drain of the fourth transistor is electrically connected to a sixth wiring,
wherein the other of the source and the drain of the third transistor and the other of the source and the drain of the fourth transistor are electrically connected to a seventh wiring, and
wherein a potential of the sixth wiring is fixed.

16. The semiconductor device according to claim 15,
wherein the first to fourth transistors are each an n-channel transistor, and
wherein the fifth transistor is a p-channel transistor.

17. The semiconductor device according to claim 15,
wherein the first and second transistors each comprise an oxide semiconductor in a semiconductor layer.

18. The semiconductor device according to claim 17,
wherein the third and fourth transistors each comprise an oxide semiconductor in a semiconductor layer.

19. The semiconductor device according to claim 15,
wherein the potential of the sixth wiring is fixed to a potential GND.

20. An electronic component comprising:
the semiconductor device according to claim 15; and
a lead electrically connected to the semiconductor device.

21. An electronic appliance comprising:
the electronic component according to claim 20; and
a display device.

* * * * *